US012757414B2

(12) United States Patent
Leow et al.

(10) Patent No.: US 12,757,414 B2
(45) Date of Patent: Oct. 6, 2026

(54) BONDABLE PILLARS FOR WIRE BONDS IN A SEMICONDUCTOR PACKAGE

(71) Applicant: Micron Technology, Inc., Boise, ID (US)

(72) Inventors: See Hiong Leow, Singapore (SG); Hong Wan Ng, Singapore (SG); Seng Kim Ye, Singapore (SG); Kelvin Aik Boo Tan, Singapore (SG); Ling Pan, Singapore (SG)

(73) Assignee: Micron Technology, Inc., Boise, ID (US)

(*) Notice: Subject to any disclaimer, the term of this patent is extended or adjusted under 35 U.S.C. 154(b) by 370 days.

(21) Appl. No.: 18/530,896

(22) Filed: Dec. 6, 2023

(65) Prior Publication Data

US 2024/0194630 A1 Jun. 13, 2024

Related U.S. Application Data

(60) Provisional application No. 63/387,199, filed on Dec. 13, 2022.

(51) Int. Cl.
*H01L 23/00* (2006.01)
*H01L 21/48* (2006.01)
(Continued)

(52) U.S. Cl.
CPC .......... *H10B 80/00* (2023.02); *H10W 70/093* (2026.01); *H10W 90/00* (2026.01);
(Continued)

(58) Field of Classification Search
CPC .... H10B 80/00; H10W 70/093; H10W 90/00; H10W 72/075; H10W 72/07536; H10W 72/07554; H10W 72/547; H10W 72/5522; H10W 72/952; H10W 90/752; H10W 90/754; H10W 90/701; H10W 70/465; H01L 2225/06506; H01L 2225/0651; H01L 2225/06562; H01L 24/45; H01L 24/48; H01L 24/49; H01L 25/0657; H01L 25/18;
(Continued)

(56) References Cited

U.S. PATENT DOCUMENTS

2014/0061932 A1* 3/2014 Chen ..................... H10W 90/00
257/E23.116
2016/0315040 A1* 10/2016 Son ..................... H10W 70/093
(Continued)

*Primary Examiner* — Tong-Ho Kim
(74) *Attorney, Agent, or Firm* — Harrity & Harrity, LLP

(57) ABSTRACT

Implementations described herein relate to various semiconductor device assemblies. In some implementations, a semiconductor device assembly may include a substrate including multiple first electrical contacts and multiple bondable pillars. In some implementations, each bondable pillar, of the multiple bondable pillars, may be coupled to a corresponding first electrical contact, of the multiple first electrical contacts. The semiconductor device assembly may further include one or more dies coupled to the substrate and including multiple second electrical contacts. In some implementations, the semiconductor device assembly may include multiple wire bonds, with each wire bond, of the multiple wire bonds, bonding a second electrical contact, of the multiple second electrical contacts, to a bondable pillar, of the multiple bondable pillars.

25 Claims, 16 Drawing Sheets

(51) Int. Cl.

| | |
|---|---|
| ***H01L 25/00*** | (2006.01) |
| ***H01L 25/18*** | (2023.01) |
| ***H10B 80/00*** | (2026.01) |
| ***H10W 70/05*** | (2026.01) |
| ***H10W 90/00*** | (2026.01) |
| *H10W 72/00* | (2026.01) |
| *H10W 72/50* | (2026.01) |
| *H10W 72/90* | (2026.01) |

(52) U.S. Cl.
CPC .... *H10W 72/075* (2026.01); *H10W 72/07536* (2026.01); *H10W 72/07554* (2026.01); *H10W 72/547* (2026.01); *H10W 72/5522* (2026.01); *H10W 72/952* (2026.01); *H10W 90/752* (2026.01); *H10W 90/754* (2026.01)

(58) Field of Classification Search
CPC .................... H01L 25/50; H01L 24/85; H01L 2224/48249
USPC .......................................................... 257/772
See application file for complete search history.

(56) References Cited

U.S. PATENT DOCUMENTS

| | | | | |
|---|---|---|---|---|
| 2019/0341366 | A1* | 11/2019 | Chen | H10W 90/00 |
| 2020/0075548 | A1* | 3/2020 | Kim | H10W 90/00 |
| 2020/0152579 | A1* | 5/2020 | Vincent | H10W 42/20 |
| 2021/0366875 | A1* | 11/2021 | Di | H10W 90/00 |

* cited by examiner

BONDABLE PILLARS FOR WIRE BONDS IN A SEMICONDUCTOR PACKAGE

CROSS REFERENCE TO RELATED APPLICATION

This Patent Application claims priority to U.S. Provisional Patent Application No. 63/387,199, filed on Dec. 13, 2022, and entitled "BONDABLE PILLARS FOR WIRE BONDS IN A SEMICONDUCTOR PACKAGE." The disclosure of the prior Application is considered part of and is incorporated by reference into this Patent Application.

TECHNICAL FIELD

The present disclosure generally relates to semiconductor devices and methods of forming semiconductor devices. For example, the present disclosure relates to bondable pillars for wire bonds in a semiconductor package.

BACKGROUND

A semiconductor package includes a casing that contains one or more semiconductor devices, such as integrated circuits. Semiconductor device components may be fabricated on semiconductor wafers before being diced into die and then packaged. A semiconductor package protects internal components from damage and includes means for connecting internal components to external components (e.g., a circuit board), such as via balls, pins, or leads. A semiconductor package is sometimes referred to as a semiconductor device assembly.

DETAILED DESCRIPTION

Figure 1:
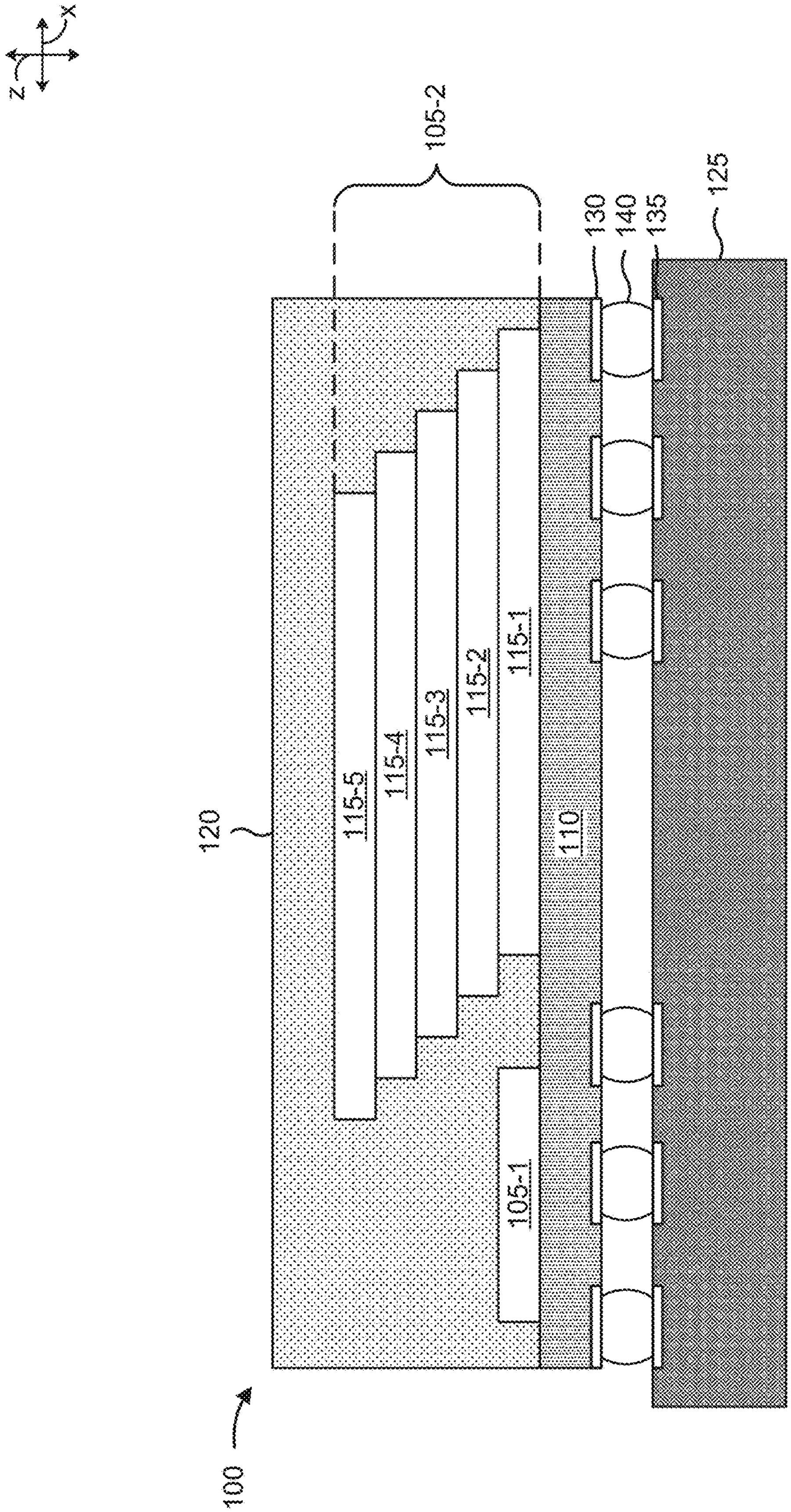
FIG. 1 is a diagram of an example apparatus that may be manufactured using techniques described herein.

In semiconductor device assemblies and/or semiconductor packages, components may be bonded to one another via multiple wire bonds. For example, managed NAND (mNAND) packages and/or multichip packages (MCP) may include multiple stacked dies (e.g., a die stack) on a substrate, such as a NAND stack or another memory die stack coupled to the substrate. The substrate may include multiple electrical contacts, such as lead fingers associated with a lead frame in the substrate, that are electrically coupled to corresponding electrical contacts provided on the dies, such as bond pads, terminals, or similar electrical contacts. In some examples, the electrical contacts of the substrate may be electrically coupled to the electrical contacts of the dies via multiple wire bonds.

For die stacks including many dies, such as NAND stacks in an mNAND device that include eight or more NAND dies, wires used for bonding upper dies to the substrate may be relatively long, resulting in sagging or sweeping wires that may interfere with other wires and/or electrical contacts. For example, the sagging or sweeping wires may contact nearby wires (e.g., wires associated with neighboring dies and/or neighboring wires associated the same die), thereby shorting the wires and causing faulty performance and defects within the semiconductor device assembly. As a complexity of mNAND devices, MCP devices, and similar devices continually evolves to include more components and/or higher die stacks, problems caused by sagging and/or sweeping wires may increase, resulting in high defect rates and otherwise faulty performance of semiconductor packages.

Some implementations described herein enable shorter wire bonds for semiconductor packages, thereby reducing or eliminating semiconductor package defects associated with sagging and/or sweeping wires. In some implementations, a semiconductor device assembly may include bondable pillars that are soldered or otherwise coupled to electrical contacts (e.g., lead fingers) associated with the substrate. One or more dies (e.g., memory dies associated with a memory die stack, or similar semiconductor dies) may be electrically coupled to the substrate via the bondable pillars, and, more particularly, via wire bonds coupling electrical contacts of the dies, such as bond pads, terminals, or similar electrical contacts, to the bondable pillars. The bondable pillars may be sized and/or located such that an upper, distal end of each bondable pillar is located approximately 30 micrometers (μm) below a corresponding electrical connection (e.g., bond pad) to which the bondable pillar is electrically coupled, thereby enabling a good wire bond profile while maintaining a relatively short length of wire used for the wire bond. As a result of bonding bond pads of die stacks to bondable pillars instead of directly to a surface of the substrate, shorter wires may be implemented thereby reducing the risk of shorting wires due to wire sagging and/or wire sweeping. Accordingly, defects and faulty performance of semiconductor packages may be reduced. Moreover, shorter lengths of gold wires may be used to form the wire bonds between the dies and the bondable pillars than would otherwise be needed to form the wire bonds between the dies and the surface of the substrate, thereby reducing manufacturing costs. These and other features may be more readily apparent in connection with the description of FIGS. 1-8, below.

FIG. 1 is a diagram of an example apparatus 100 that may be manufactured using techniques described herein.

In FIG. 1 and the figures that follow, each of the illustrated x-axis, y-axis, and z-axis is substantially perpendicular to the other two axes. In other words, the x-axis is substantially perpendicular to the y-axis and the z-axis, the y-axis is substantially perpendicular to the x-axis and the z-axis, and the z-axis is substantially perpendicular to the x-axis and the y-axis. In some cases, a single reference number is shown to refer to a surface, or fewer than all instances of a part may be labeled with all surfaces of that part. All instances of the part may include associated surfaces of that part despite not every surface being labeled.

The apparatus 100 may include any type of device or system that includes one or more integrated circuits 105. For example, the apparatus 100 may include a memory device, a flash memory device, a NAND memory device, a NOR memory device, a random access memory (RAM) device, a read-only memory (ROM) device, a dynamic RAM (DRAM) device, a static RAM (SRAM) device, a synchronous dynamic RAM (SDRAM) device, a ferroelectric RAM (FeRAM) device, a magnetic RAM (MRAM) device, a resistive RAM (RRAM) device, a holographic RAM (HRAM) device, a solid state drive (SSD), a microchip, and/or a system on a chip (SoC), among other examples. In some cases, the apparatus 100 may be referred to as a semiconductor package, an assembly, a semiconductor device assembly, or an integrated assembly.

As shown in FIG. 1, the apparatus 100 may include one or more integrated circuits 105, shown as a first integrated circuit 105-1 and a second integrated circuit 105-2, disposed on a substrate 110. An integrated circuit 105 may include any type of circuit, such as an analog circuit, a digital circuit, a radiofrequency (RF) circuit, a power supply, an input-output (I/O) chip, an application-specific integrated circuit (ASIC), a field-programmable gate array (FPGA), and/or a memory device (e.g., a NAND memory device, a NOR memory device, a RAM device, or a ROM device). An integrated circuit 105 may be mounted on or otherwise disposed on a surface of the substrate 110. Although the apparatus 100 is shown as including two integrated circuits 105 as an example, the apparatus 100 may include a different number of integrated circuits 105.

In some implementations, an integrated circuit 105 may include multiple semiconductor dies 115 (sometimes called dies), shown as five semiconductor dies 115-1 through 115-5. As shown in FIG. 1, the dies 115 may be stacked on top of each other to reduce a footprint of the apparatus 100. The stacked dies 115 may include three-dimensional electrical interconnects, such as through-silicon vias (TSVs), to route electrical signals between dies 115. Although the integrated circuit 105-2 is shown as including five dies 115, an integrated circuit 105 may include a different number of dies 115 (e.g., at least two dies 115). A first die 115-1 (sometimes called a bottom die or a base die) may be disposed on the substrate 110, a second die 115-2 may be disposed on the first die 115-1, and so on.

The apparatus 100 may include a casing 120 that protects internal components of the apparatus 100 (e.g., the integrated circuits 105) from damage and environmental elements (e.g., particles) that can lead to malfunction of the apparatus 100. The casing 120 may be a plastic (e.g., an epoxy plastic), a ceramic, or another type of material depending on the functional requirements for the apparatus 100.

In some implementations, the apparatus 100 may be included as part of a higher level system (e.g., a computer, a mobile phone, a network device, an SSD, a vehicle, or an Internet of Things device), such as by electrically connecting the apparatus 100 to a circuit board 125, such as a printed circuit board. For example, the substrate 110 may be disposed on the circuit board 125 such that electrical contacts 130 (e.g., bond pads) of the substrate 110 are electrically connected to electrical contacts 135 (e.g., bond pads) of the circuit board 125.

In some implementations, the substrate 110 may be mounted on the circuit board 125 using solder balls 140 (e.g., arranged in a ball grid array), which may be melted to form a physical and electrical connection between the substrate 110 and the circuit board 125. Additionally, or alternatively, the substrate 110 may be mounted on and/or electrically connected to the circuit board 125 using another type of connector, such as pins or leads. Similarly, an integrated circuit 105 may include electrical pads (e.g., bond pads) that are electrically connected to corresponding electrical pads (e.g., bond pads) of the substrate 110 using electrical bonding, such as wire bonding, bump bonding, or the like. The interconnections between an integrated circuit 105, the substrate 110, and the circuit board 125 enable the integrated circuit 105 to receive and transmit signals to other components of the apparatus 100 and/or the higher level system.

As indicated above, FIG. 1 is provided as an example. Other examples may differ from what is described with regard to FIG. 1.

Figure 2:
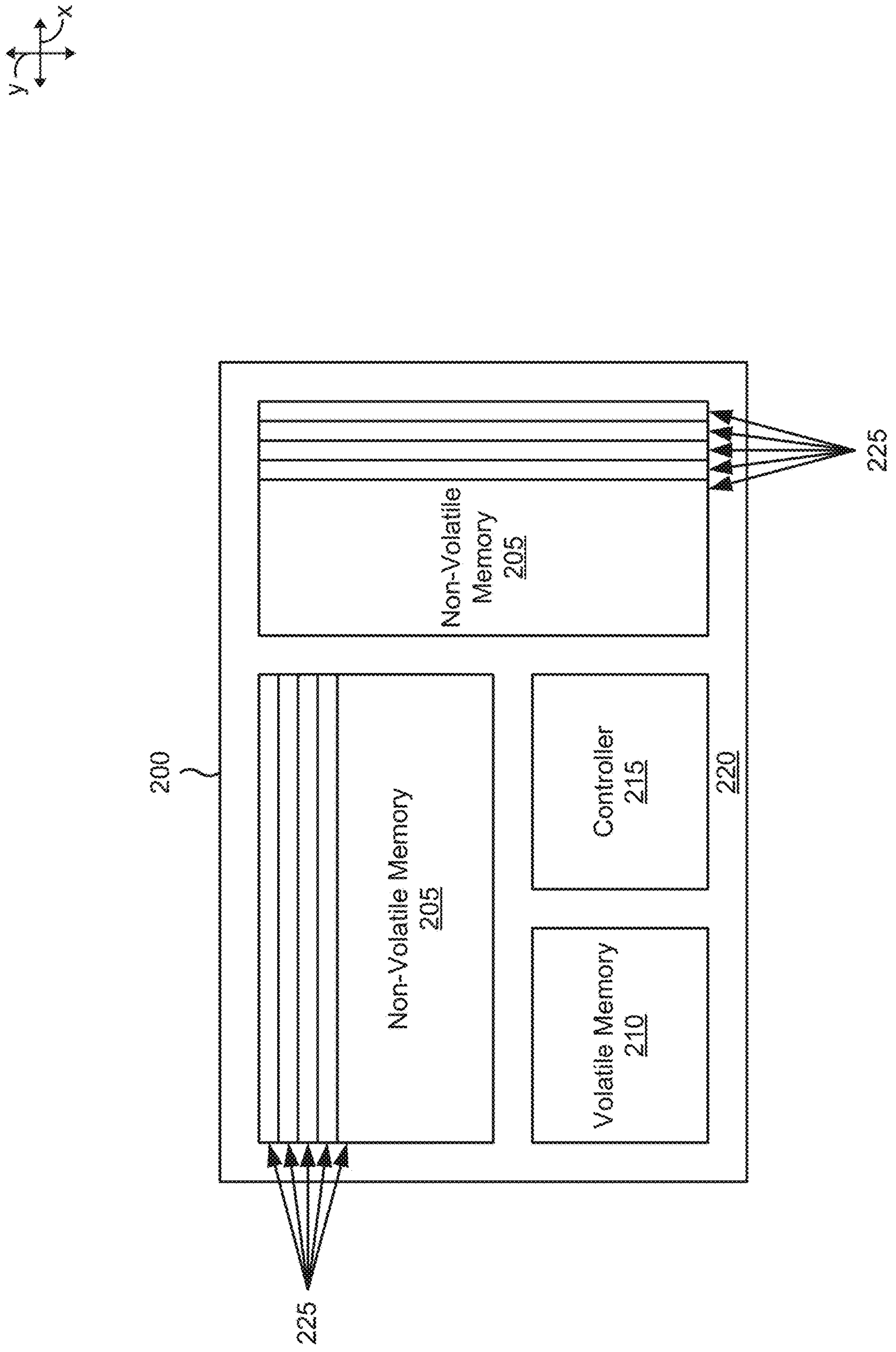
FIG. 2 is a diagram of an example memory device that may be manufactured using techniques described herein.

FIG. 2 is a diagram of an example memory device 200 that may be manufactured using techniques described herein. The memory device 200 is an example of the apparatus 100 described above in connection with FIG. 1. The memory device 200 may be any electronic device configured to store data in memory. In some implementations, the memory device 200 may be an electronic device configured to store data persistently in non-volatile memory 205. For example, the memory device 200 may be a hard drive, an SSD, a flash memory device (e.g., a NAND flash memory device or a NOR flash memory device), a universal serial bus (USB) thumb drive, a memory card (e.g., a secure digital (SD) card), a secondary storage device, a non-volatile memory express (NVMe) device, an embedded multimedia card (eMMC) device, an mNAND device, or an MCP device, among other examples.

As shown, the memory device 200 may include non-volatile memory 205, volatile memory 210, and a controller 215. The components of the memory device 200 may be mounted on or otherwise disposed on a substrate 220. In some implementations, the non-volatile memory 205 includes stacked semiconductor dies 225, as described above in connection with FIG. 1.

The non-volatile memory 205 may be configured to maintain stored data after the memory device 200 is powered off. For example, the non-volatile memory 205 may include NAND memory or NOR memory. The volatile memory 210 may require power to maintain stored data and may lose stored data after the memory device 200 is powered off. For example, the volatile memory 210 may include one or more latches and/or RAM, such as DRAM and/or SRAM. As an example, the volatile memory 210 may cache data read from or to be written to non-volatile memory 205, and/or may cache instructions to be executed by the controller 215.

The controller 215 may be any device configured to communicate with the non-volatile memory 205, the volatile memory 210, and a host device (e.g., via a host interface of the memory device 200). For example, the controller 215 may include a memory controller, a system controller, an ASIC, an FPGA, a processor, a microcontroller, and/or one or more processing components. In some implementations, the memory device 200 may be included in a system that includes the host device. The host device may include one or more processors configured to execute instructions and store data in the non-volatile memory 205.

The controller 215 may be configured to control operations of the memory device 200, such as by executing one or more instructions (sometimes called commands). For example, the memory device 200 may store one or more instructions as firmware, and the controller 215 may execute those one or more instructions. Additionally, or alternatively, the controller 215 may receive one or more instructions from a host device via a host interface, and may execute those one or more instructions. For example, the controller 215 may transmit signals to and/or receive signals from the non-volatile memory 205 and/or the volatile memory 210 based on the one or more instructions, such as to transfer data to (e.g., write or program), to transfer data from (e.g., read), and/or to erase all or a portion of the non-volatile memory 205 (e.g., one or more memory cells, pages, sub-blocks, blocks, or planes of the non-volatile memory 205).

As indicated above, FIG. 2 is provided as an example. Other examples may differ from what is described with regard to FIG. 2. The number and arrangement of components shown in FIG. 2 are provided as an example. In practice, there may be additional components, fewer components, different components, or differently arranged components than those shown in FIG. 2.

Figure 3A:
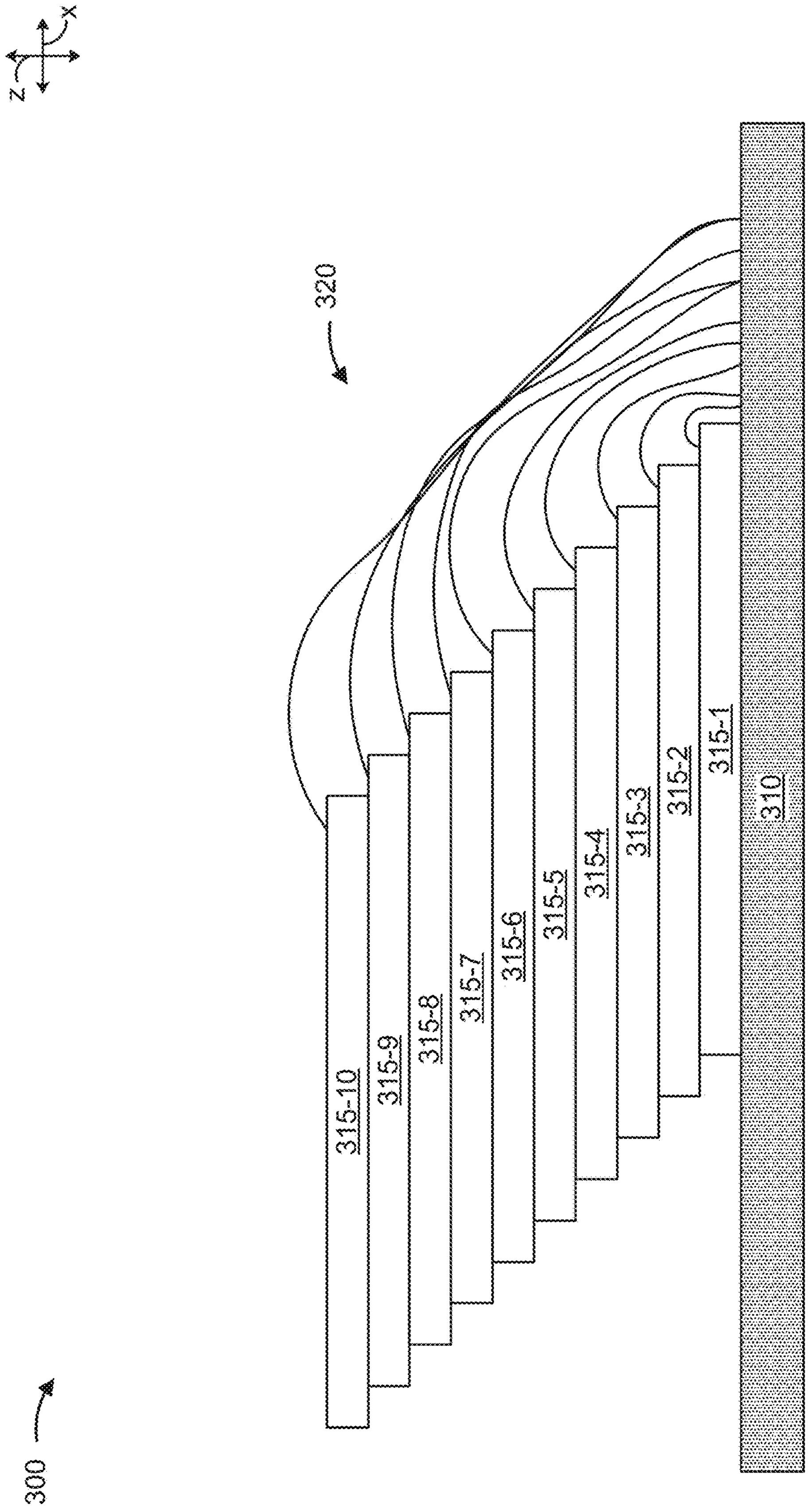
FIGS. 3A-3B are diagrams of an example semiconductor device assembly that includes multiple stacked dies bonded to a substrate using a traditional wire bonding process and using bondable pillars.
Figure 3B:
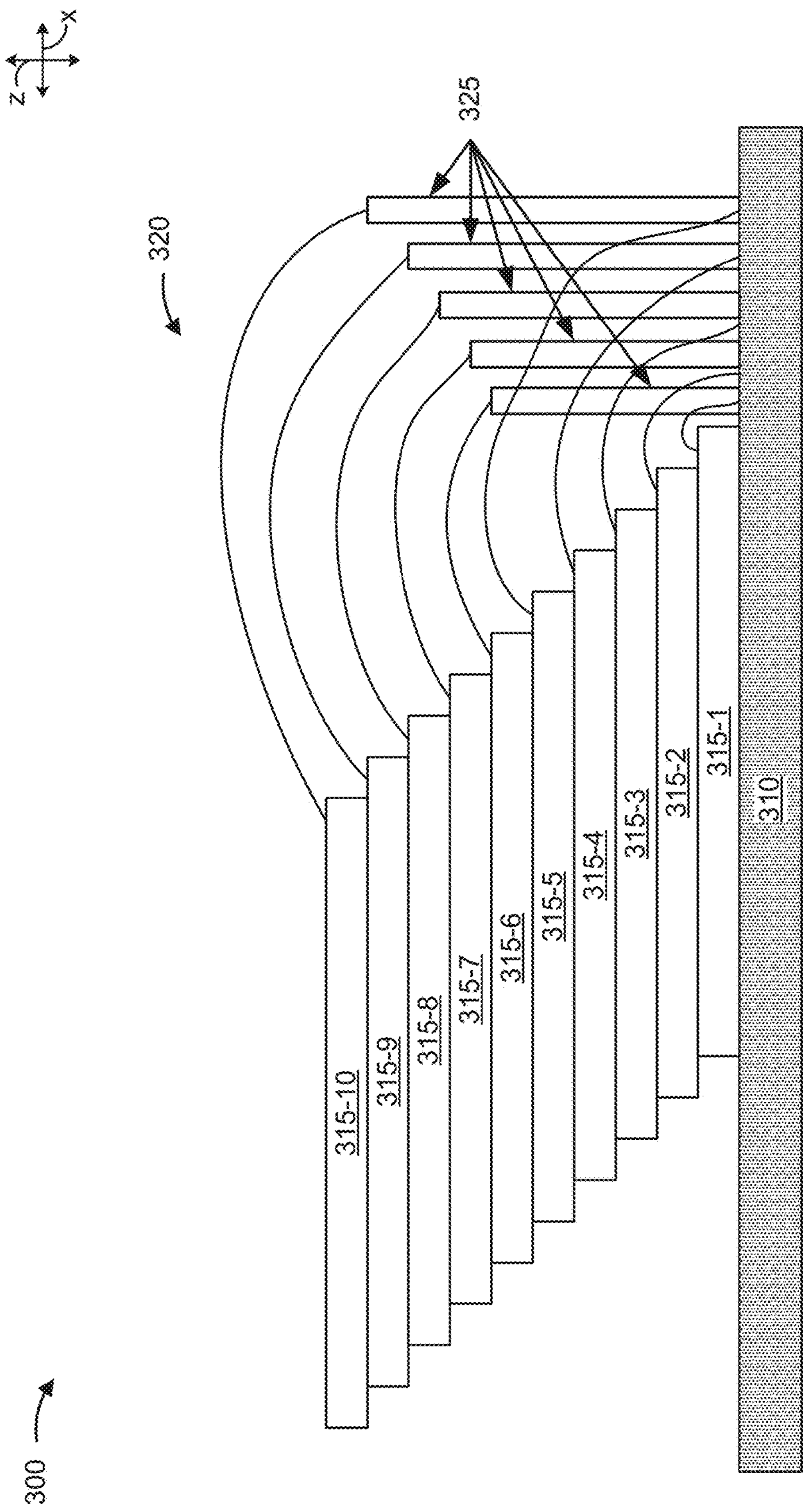

FIGS. 3A-3B are diagrams of an example semiconductor device assembly 300 that includes multiple stacked dies bonded to a substrate using a traditional wire bonding process and using bondable pillars.

As shown in FIG. 3A, a semiconductor device may include multiple stacked dies, each bonded to a substrate via one or more wire bonds. Due to the tall die stack, and thus a relatively large distance (in the z-axis direction) between a surface of the substrate and electrical contacts (e.g., bond pads) on dies located near the top of the die stack, wires used to bond the dies to the substrate may be prone to sagging and/or sweeping, thereby shorting neighboring wires and causing defects and faulty performance in the semiconductor device assembly 300.

More particularly, as shown in FIG. 3A, the semiconductor device assembly 300 may include a substrate 310 with multiple dies 315, shown as dies 315-1 through 315-10, coupled thereto, among other semiconductor components such as any of the components described above in connection with FIGS. 1-2. In some implementations, the multiple dies may correspond to a die stack (e.g., stacked semiconductor dies 225). Each die 315 may be electrically coupled to the substrate 310 via one or more wire bonds 320. For example, each die 315 may include bond pads or similar electrical contacts for coupling the die 315 to other components in the semiconductor device assembly 300, such as other dies 315 and/or the substrate 310, via the wire bonds 320. Similarly, the substrate 310 may include electrical contacts, such as lead fingers or similar electrical contacts, for receiving the wire bonds 320, thereby forming an electrical connection between the dies 315 and the substrate 310.

For dies near a bottom of the die stack (e.g., dies 315-1 to 315-5), the corresponding wire bonds may be performed using a relatively short length of wire. Accordingly, these wire bonds may pose little risk of sagging, sweeping, or otherwise interfering with and/or shorting nearby wire bonds. More particularly, as shown in FIG. 3A, the bottom five wire bonds 320 do not contact or otherwise interfere with other wire bonds 320. However, for dies 315 farther up in the die stack, such as dies near the top of the die stack (e.g., dies 315-6 to 315-10), the corresponding wire bonds 320 may be performed using a relatively long length of wire, creating an increased risk of wire sagging, wire sweeping, or wires otherwise interfering with and/or shorting nearby wire bonds 320. More particularly, as shown in FIG. 3A, the wires for the top five dies 315 (e.g., dies 315-6 through 315-10) are sagging and/or sweeping and thus contacting one another, which may lead to shorting of the wires and otherwise faulty performance of the semiconductor device assembly 300.

In order to reduce the risk of wire sag and/or sweep and thus reduce the risk of shorting wire bonds, in some implementations the semiconductor device assembly 300 may include bondable pillars for receiving wire bonds originating from certain dies 315. More particularly, FIG. 3B shows an example in which the semiconductor device assembly 300 includes multiple bondable pillars 325 used for receiving wire bonds 320. In some implementations, each bondable pillar 325 may be electrically coupled to a corresponding electrical contact (e.g., lead finger) on the substrate 310, and thus may serve to extend a bondable surface of the corresponding electrical contact upward in the z-axis direction. As a result, a length of wire used to create a wire bond between a die 315 and an electrical contact on the substrate 310 may be reduced, thereby reducing the risk of wire shorting. More particularly, in the example depicted in FIG. 3B, the top five dies 315 (e.g., dies 315-6 through 315-10) may be bonded to the substrate 310 via bondable pillars 325, eliminating the interference of the wire bonds 320 shown in connection with FIG. 3A. Moreover, in some implementations, use of the bondable pillars 325 may reduce a manufacturing cost associated with the semiconductor device assembly 300, because shorter lengths of gold wire may need to be used to create the electrical connection between the dies 315 and the substrate 310. Additional features of semiconductor device assemblies including bondable pillars are described in more detail below in connection with FIGS. 4A-5G.

As indicated above, FIGS. 3A-3B are provided as examples. Other examples may differ from what is described with respect to FIGS. 3A-3B.

Figure 4A:
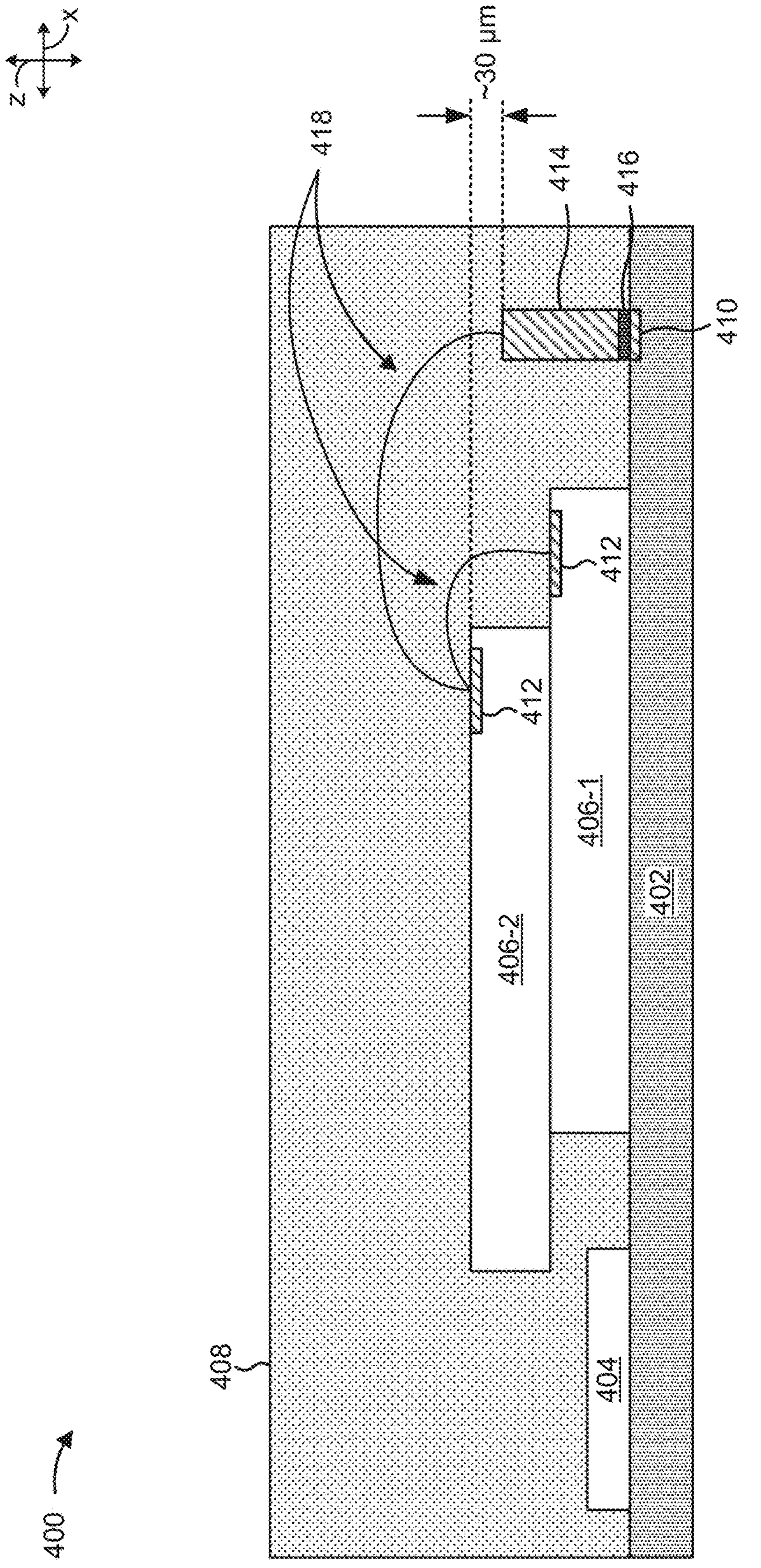
FIGS. 4A-4B are diagrams of an example semiconductor device assembly that includes dies bonded to a substrate using bondable pillars.
Figure 4B:
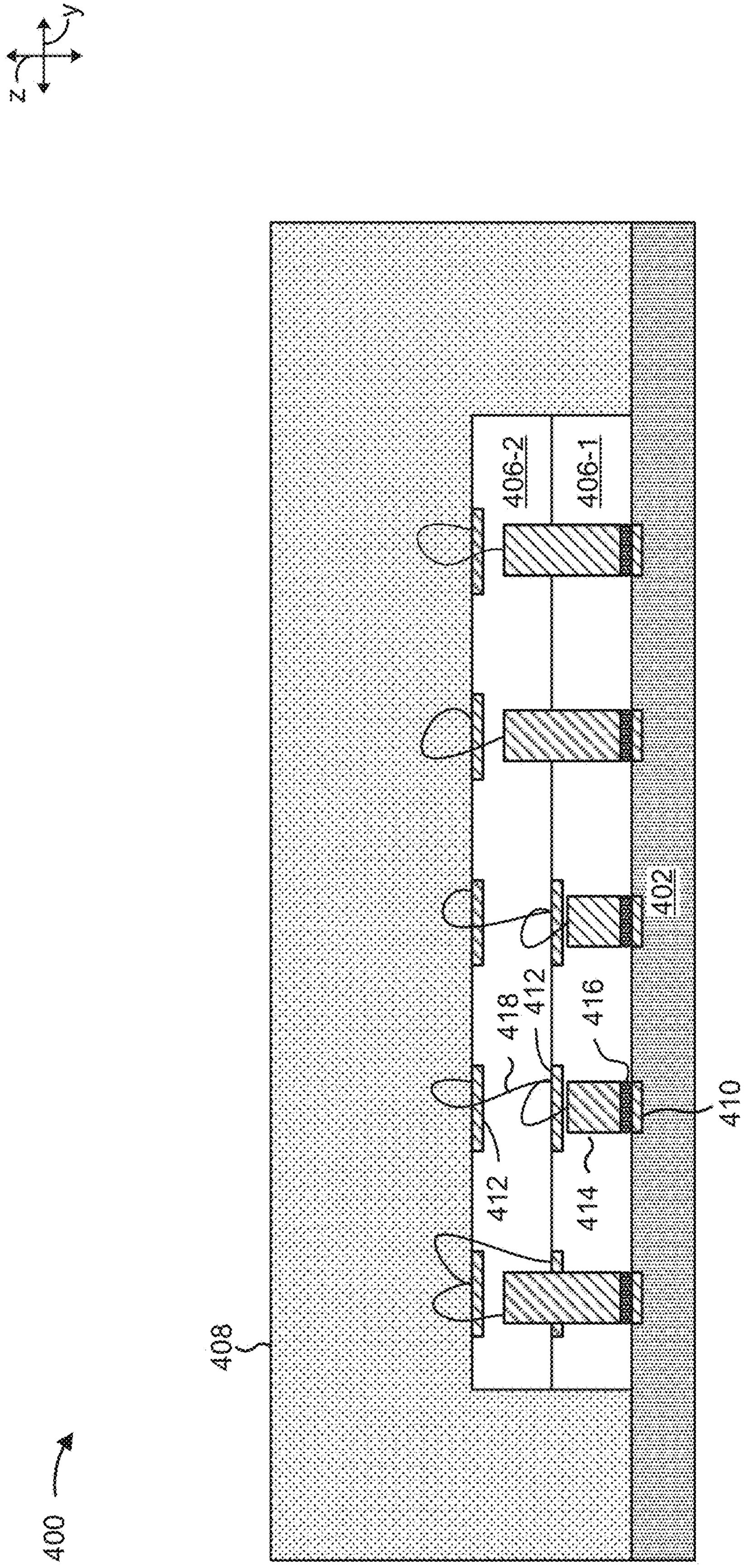

FIGS. 4A-4B are diagrams of an example semiconductor device assembly 400 that includes dies bonded to a substrate using bondable pillars. FIG. 4A shows a front elevation view of the semiconductor device assembly 400 in an x-axis and z-axis plane. FIG. 4B shows a side elevation view of the semiconductor device assembly 400 in a y-axis and z-axis plane.

In some implementations, the semiconductor device assembly 400 may include a substrate 402 and one more semiconductor components mounted to the substrate 402, such as a controller 404 (e.g., a memory controller, such as controller 215) and/or one or more dies 406 (shown as die 406-1 and 406-2). In some implementations, the multiple semiconductor dies 406 may form part of a die stack (e.g., stacked semiconductor dies 225) and/or may be associated with memory dies, such as DRAM dies (e.g., volatile memory 210), NAND dies (e.g., non-volatile memory 205), or similar dies. Although for ease of description two dies 406 are shown in FIGS. 4A and 4B, in some other implementations, more or fewer dies may implemented. For example, in some implementations, the semiconductor device assembly 400 may include a memory die stack including multiple memory dies, such as eight or more NAND dies, as described above in connection with the dies 315 of FIGS. 3A and 3B. In some implementations, the various components of the semiconductor device assembly 400 may be encapsulated in a casing 408 (e.g., casing 120), which may be an epoxy mold compound or similar material surrounding the various components and protecting the various components from exposure and contamination.

In some implementations, the substrate 402 may include multiple first electrical contacts 410, and the dies 406 may include multiple second electrical contacts 412. The multiple first electrical contacts 410 may be lead fingers associated with a lead frame of the substrate 402 or similar electrical contacts. The multiple second electrical contacts 412 may be bond pads, terminals, or similar electrical contacts. Moreover, the semiconductor device assembly 400 may include multiple bondable pillars 414 (e.g., multiple copper pillars, such as bondable pillars 325 or similar bondable pillars). In some implementations, each bondable pillar 414 may be coupled to (e.g., soldered to) a corresponding first electrical contact 410 of the substrate 402. In that regard, a cross-sectional area of each bondable pillar 414 (e.g., an area of the bondable pillar in the x-axis and y-axis plane) may be sized to substantially cover a corresponding first electrical contact 410. More particularly, a cross-sectional area of each bondable pillar 414 may be approximately equal to (e.g., within ten percent of) a surface area of a corresponding first electrical contact 410.

In some implementations, each bondable pillar 414 may be coupled to a corresponding first electrical contact 410 via a solder bond 416, such as by using a surface mount technology (SMT) process. In such implementations, each solder bond 416 may include a gold solder material. More particularly, in some implementations, each solder bond 416 may be formed using a gold solder paste. In implementations in which the bondable pillars 414 are formed from copper, using a gold solder paste to form the solder bonds 416 may result in a good intermetallic connection between the solder paste and the bondable pillars 414.

In some implementations, each second electrical contact 412 may be bonded to another electrical contact via a wire bond 418. For example, as shown in FIGS. 4A and 4B, each second electrical contact 412 may be electrically coupled to another second electrical contact 412 and/or to a bondable pillar 414 (and thus a corresponding first electrical contact 410 coupled to the bondable pillar 414) via a wire bond 418. Put another way, in some implementations, the semiconductor device assembly 400 may include multiple wire bonds 418, with each wire bond 418 bonding a second electrical contact 412 to a bondable pillar 414. In some implementations, the wire bonds 418 may include gold wires. Moreover, in implementations in which the semiconductor device assembly 400 is an mNAND device, an MCP device, or a similar device (and thus includes a memory controller (e.g., controller 404) and a memory die stack (e.g., dies 406)), the plurality of wire bonds 418 may electrically couple a memory die stack to a memory controller via the substrate 402, and, more particularly, via the bondable pillars 414 electrically coupled to the first electrical contacts 410 of the substrate 402, which may be in communication with traces or similar components in the substrate 402 that are electrically coupled to the memory controller.

In a similar manner as described above in connection with the wire bonds 320 in FIG. 3B, utilizing the bondable pillars 414 to electrically couple the first electrical contacts 410 (e.g., lead fingers) to the second electrical contacts 412 (e.g., bond pads) may operatively raise a bonding surface of the first electrical contacts 410 to an elevation (in the z-axis direction) such that a relatively short length of wire may be used to form each wire bond 418, thereby eliminating the risk of shorting due to wire sagging (e.g., unintended deformation of the wire bond 418 in the z-axis direction) and/or wire sweeping (e.g., unintended deformation of the wire bond 418 in the x-axis direction and/or the y-axis direction). In some implementations, and as shown in FIG. 4A, this may be accomplished by sizing each bondable pillar 414 such that a distal end of each bondable pillar 414 (e.g., an end opposite to a proximal end of the bondable pillar 414, which is an end that contacts the solder bond 416 and/or the first electrical contact 410) is disposed approximately 30 μm below, in the z-axis direction, a corresponding second electrical contact 412 to which the bondable pillar 414 is electrically coupled via a corresponding wire bond 418. In some implementations, disposing a distal end of each bondable pillar 414 approximately 30 μm below a corresponding second electrical contact 412 (e.g., bond pad) may result in a suitable arched profile of the wire bond 418 to provide good electrical contact between the wire and corresponding contacts and/or that reduces a risk of wire shorting due to wire sagging and/or wire sweeping. Moreover, disposing a distal end of each bondable pillar 414 approximately 30 μm below a corresponding second electrical contact 412 (e.g., bond pad) may result in a relatively short length of wire to be used for each wire bond 418, thereby reducing manufacturing costs, such as when gold wire is used for the wire bonds 418.

As indicated above, FIGS. 4A-4B are provided as examples. Other examples may differ from what is described with respect to FIGS. 4A-4B.

FIGS. 5A-5G illustrate an example of a process 500 used to fabricate a semiconductor device assembly, such as the semiconductor device assembly 400 of FIGS. 4A-4B.

Figure 5A:
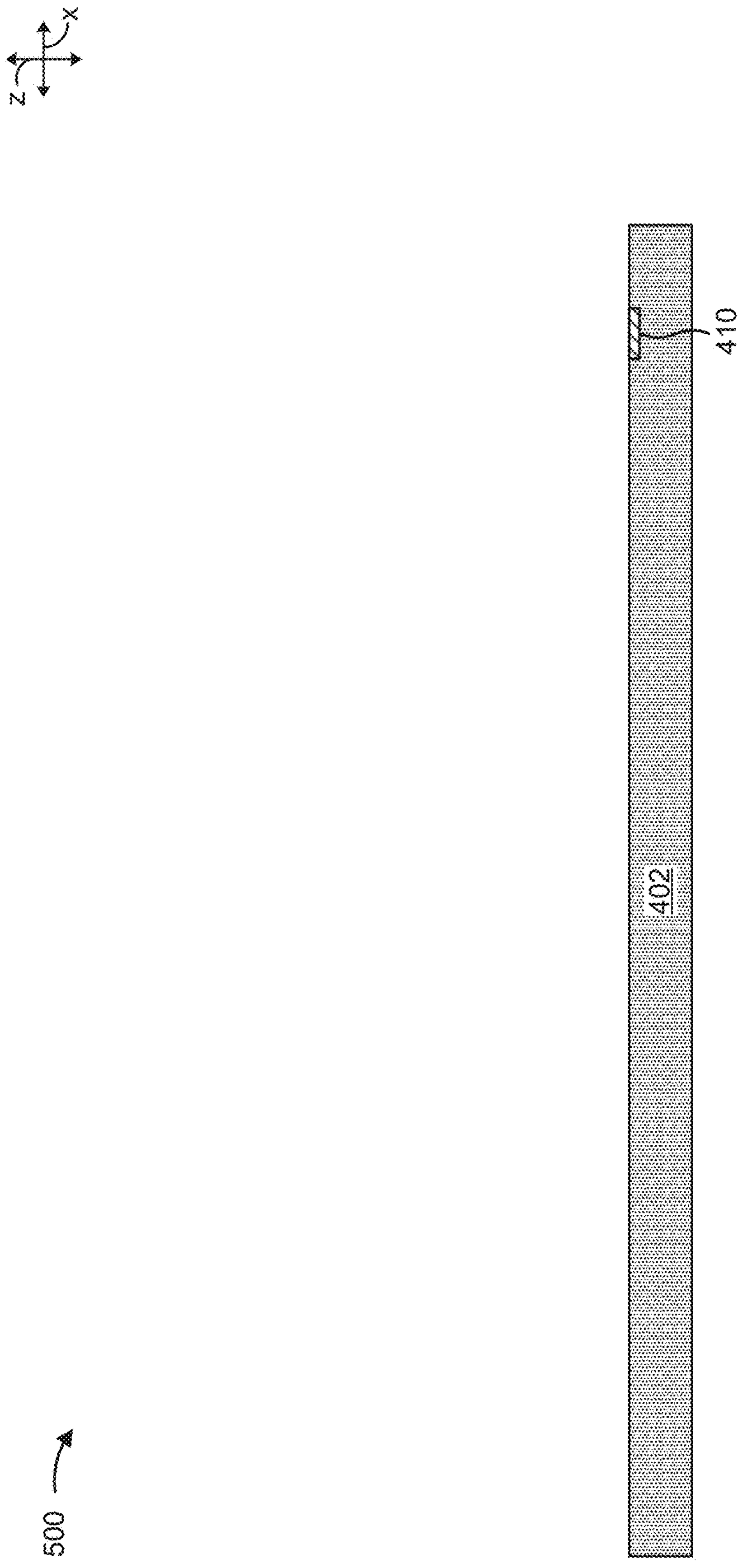
FIGS. 5A-5G illustrate an example of a process used to fabricate a semiconductor device assembly, such as the semiconductor device assembly of FIGS. 4A-4B.

As shown in FIG. 5A, the process 500 may include receiving the substrate 402 including multiple first electrical contacts 410 (e.g., lead fingers). Additionally, or alternatively, in some implementations, the process 500 may include forming the substrate 402. For example, the process 500 may include forming the substrate 402 such that the substrate 402 includes a lead frame having a plurality of lead fingers, with the lead fingers corresponding to the plurality of first electrical contacts 410 of the substrate 402.

Figure 5B:
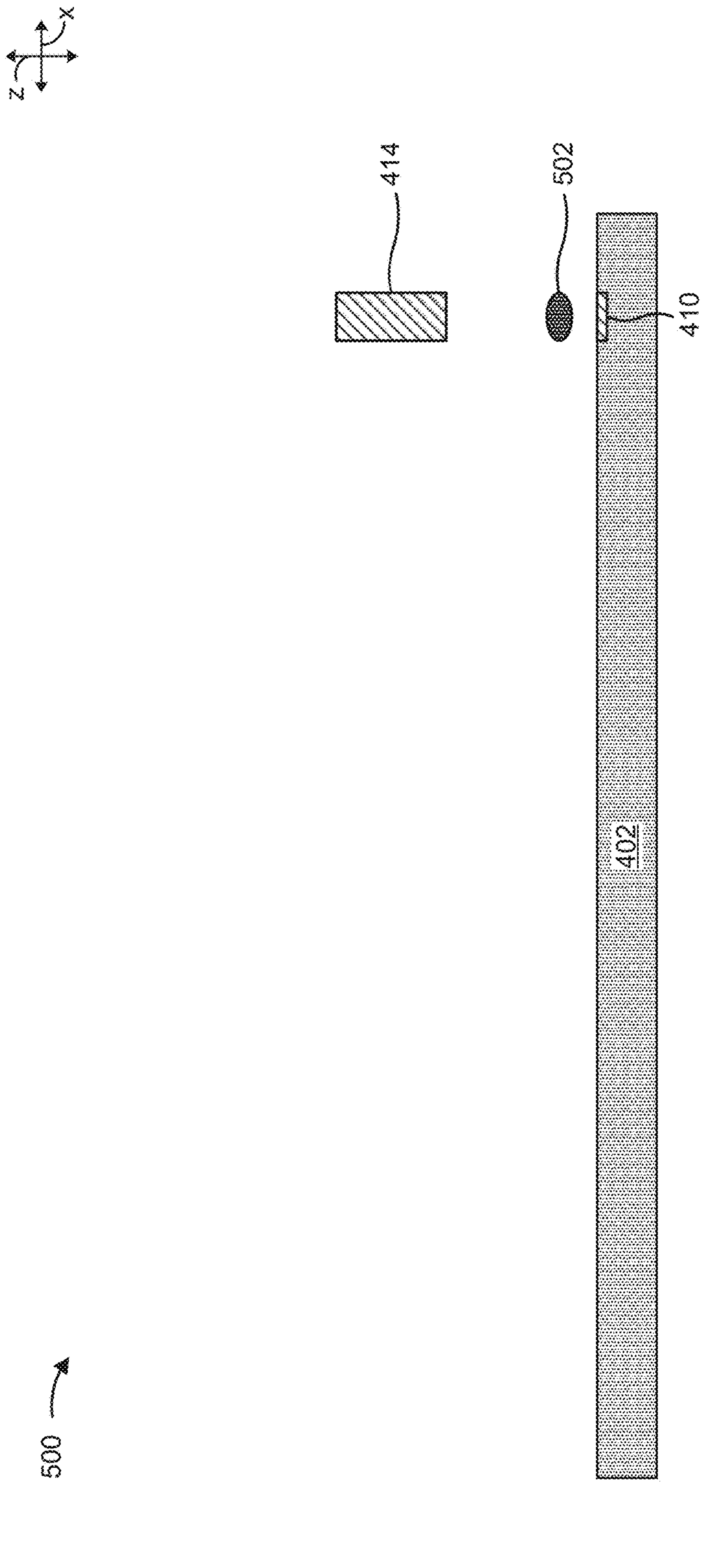
Figure 5C:
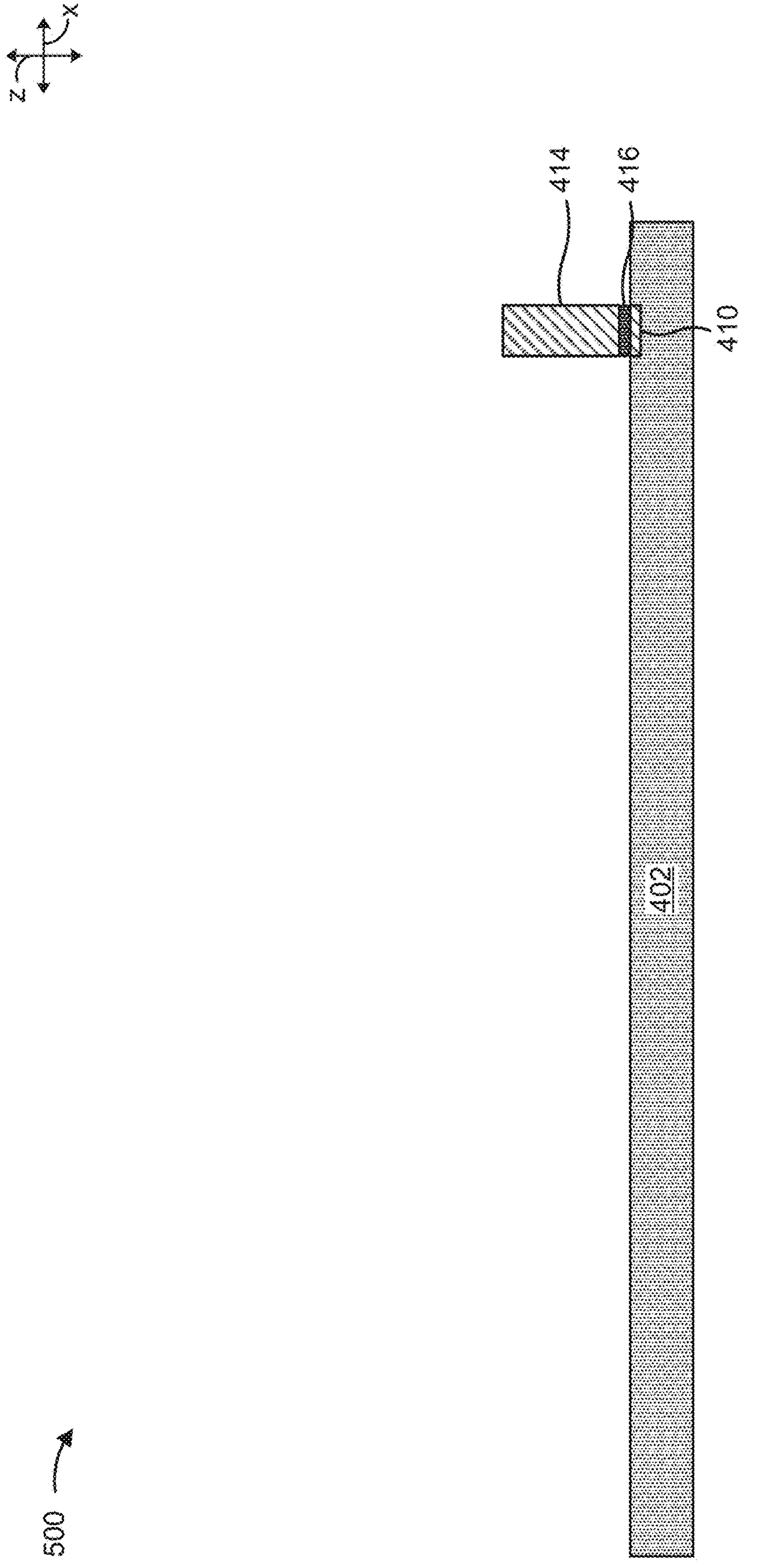

As shown in FIGS. 5B and 5C, the process 500 may include bonding the bondable pillars 414 to the substrate 402, such as by using an SMT process or a similar bonding process. More particularly, as shown in FIG. 5B, the process 500 may include receiving the bondable pillars 414 and/or a solder material, such as a solder paste 502. As described above in connection with the solder bonds 416, the solder paste 502 may be a gold solder paste. Moreover, as shown in FIG. 5C, the process 500 may include bonding the bondable pillars 414 to the substrate 402, such that each bondable pillar 414 is bonded to a corresponding first electrical contact 410 of the substrate 402. More particularly, in some implementations, bonding the bondable pillars 414 to the substrate 402 includes soldering the bondable pillars 414 to the first electrical contacts 410 using the solder paste 502 (e.g., a gold solder paste). Moreover, in implementations in which the substrate 402 includes a lead frame and/or in which the first electrical contacts 410 are lead fingers, each bondable pillar 414 may be bonded to a corresponding lead finger, such as by using an SMT process (e.g., by using the solder paste 502). Additionally, or alternatively, in implementations in which the bondable pillars 414 are copper pillars, soldering the bondable pillars 414 to the first electrical contacts 410 may include soldering the bondable pillars 414 to the first electrical contacts 410 using a gold solder paste, which may result in a good intermetallic connection, as described above in connection with FIGS. 4A-4B.

Figure 5D:
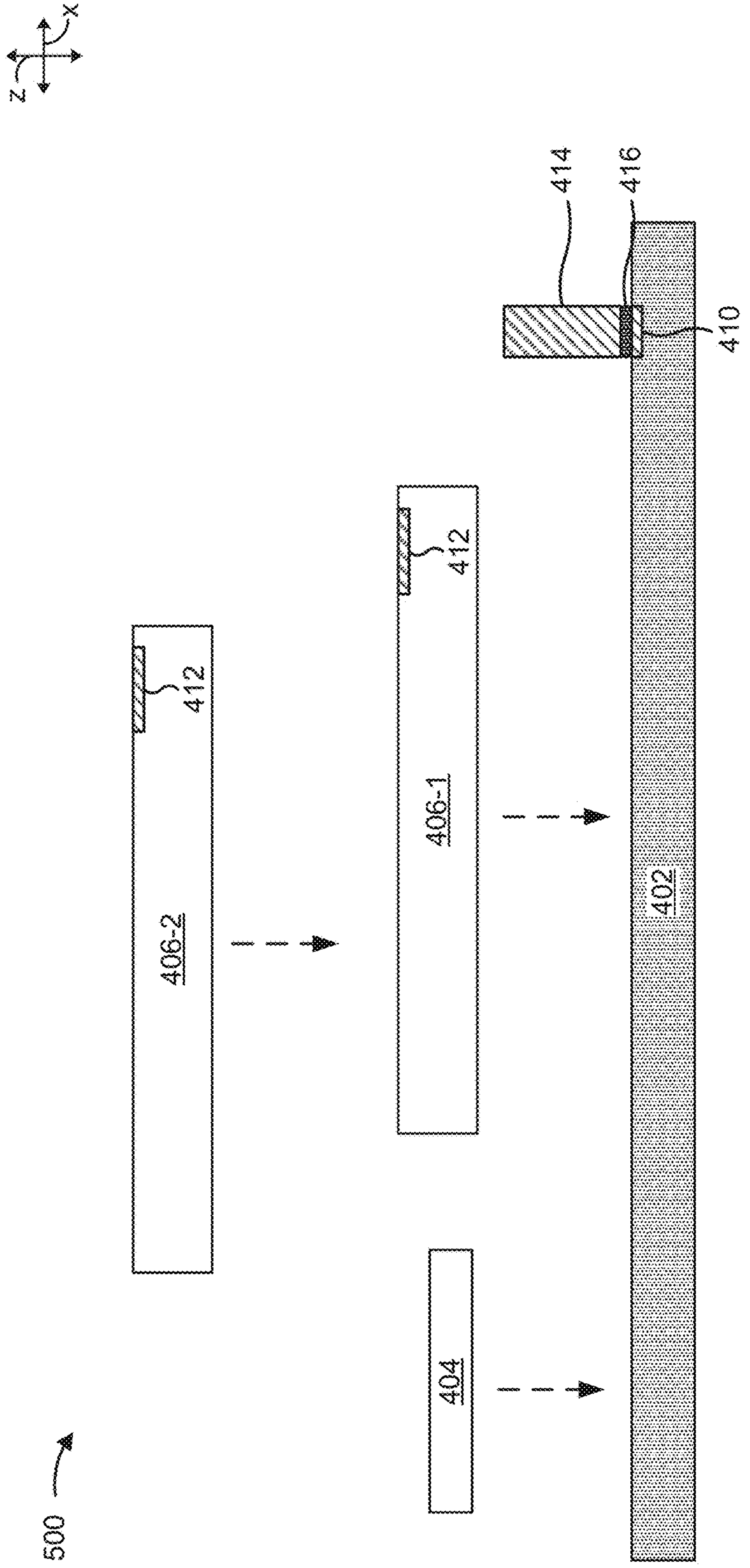
Figure 5E:
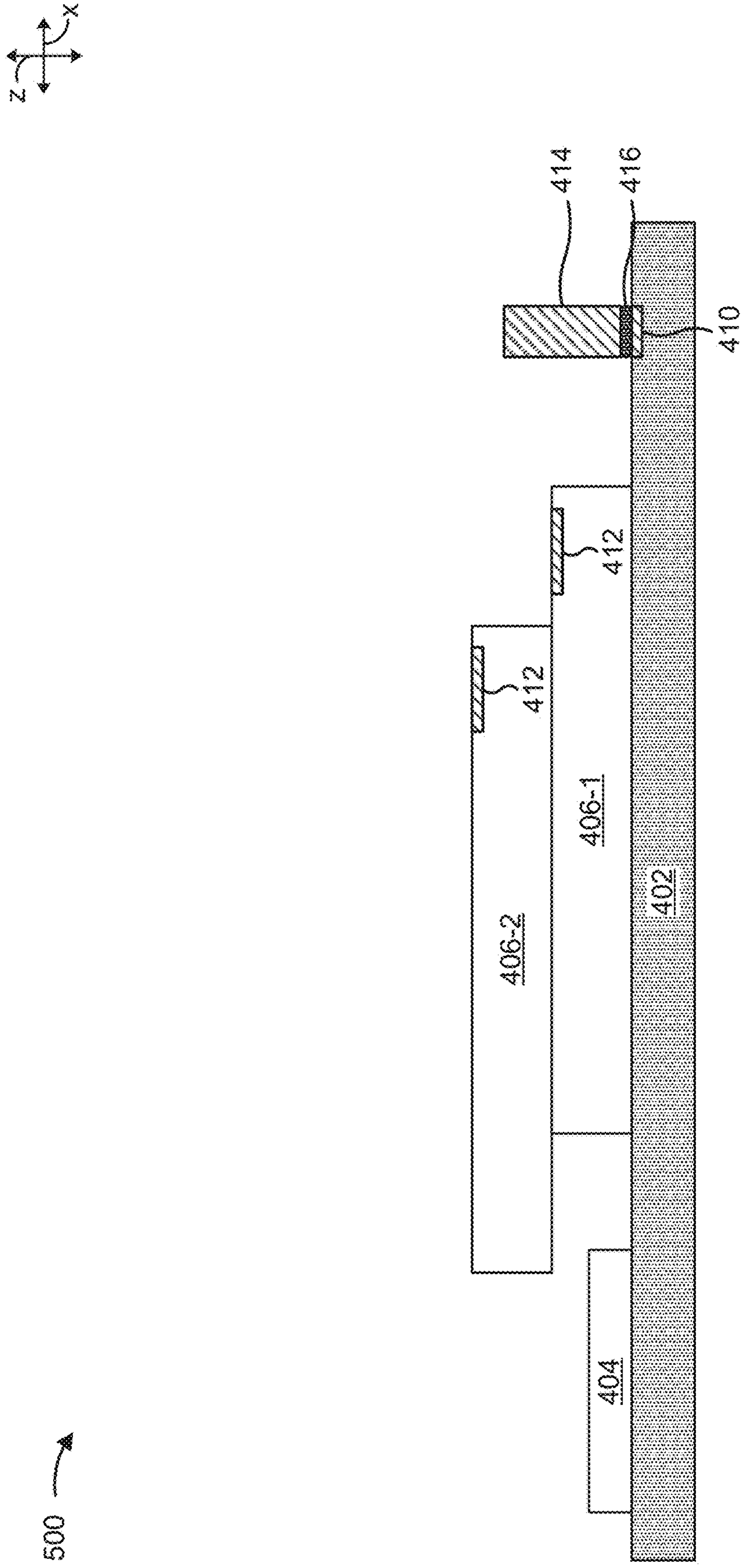

In some implementations, and as described in detail above in connection with FIGS. 4A-4B, the bondable pillars 414 may be configured to bond to wire bonds 418 electrically coupling the first electrical contacts 410 (e.g., lead fingers) to the second electrical contacts 412 associated with the dies 406. In such implementations, and as shown by FIG. 5D, the process 500 may include receiving one or more semiconductor components and/or integrated circuits for mounting on the substrate 402. More particularly, the process 500 may include receiving the controller 404 (e.g., a memory controller), the dies 406 (e.g., memory dies), and/or other components (e.g., passive components of a semiconductor package, such as a capacitor and/or resistor, and similar components).

Moreover, as shown by reference number 5E, the process 500 may include coupling the controller 404 and/or the one or more dies 406 to the substrate 402, with the one or more dies 406 including second electrical contacts 412. In some implementations, the controller 404, the dies 406, and/or other components may be coupled to the substrate 402 using a soldering process. For example, in some implementations, the controller 404 may be a flip chip controller including an array of solder balls printed on a surface of the controller 404, which is thus coupled to substrate 402 via a solder reflow process and/or an underfill process. In some other implementations, the controller 404, the dies 406, and/or other components may be coupled to the substrate 402 using an adhesive or similar material. For example, in some implementations, the dies 406 may be coupled to the substrate using a paste, a die attach film (DAF), or a similar adhesive material.

Figure 5F:
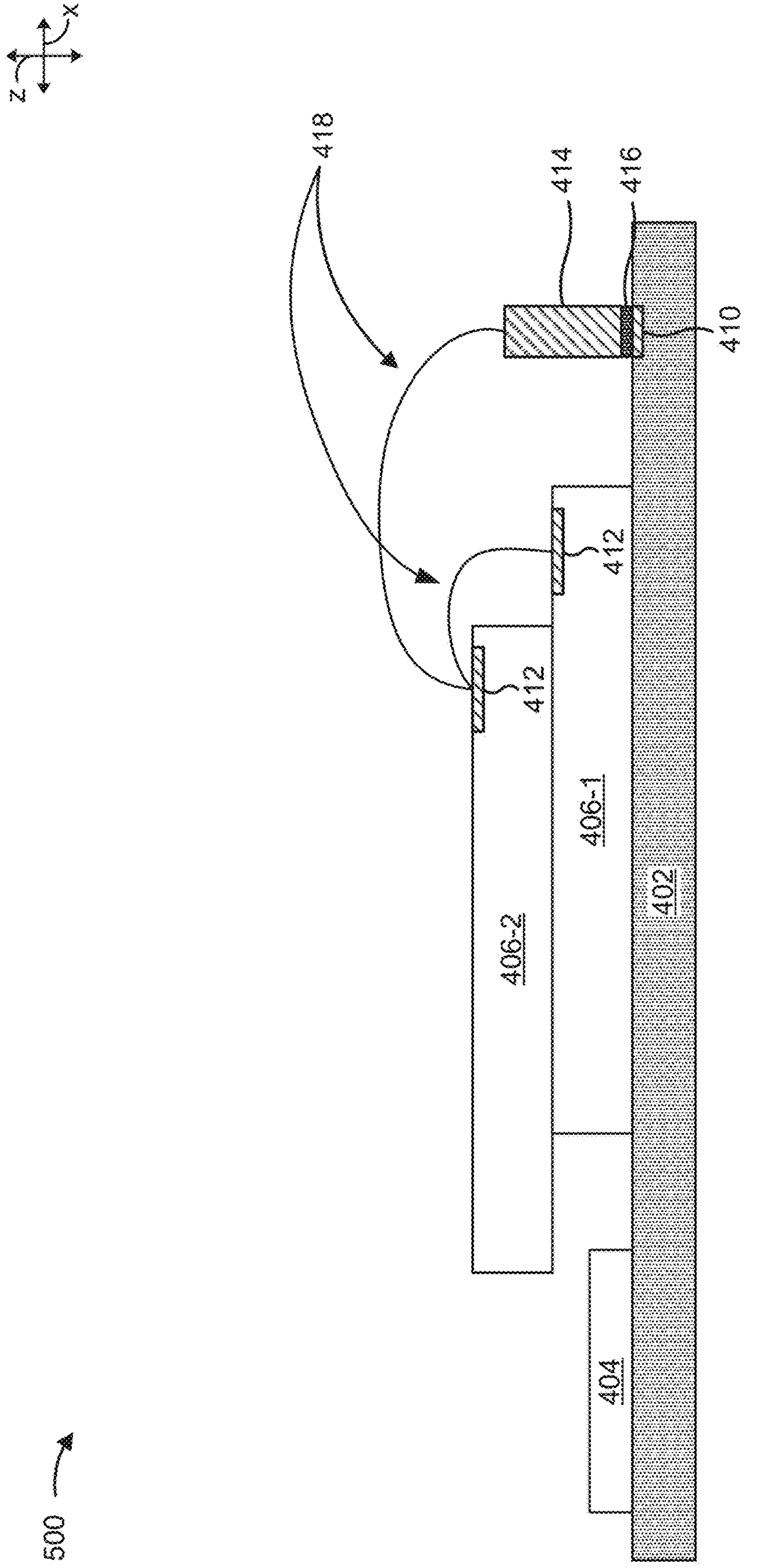

As shown by FIG. 5F, the process 500 may include bonding the dies 406 to the bondable pillars 414 via the wire bonds 418, such as by bonding each wire bond 418 to a second electrical contact 412 and a bondable pillar 414 (and, more particularly, a distal end of a bondable pillar 414). In some implementations, each wire bond 418 may be soldered to a respective second electric contact 412 (e.g., a bond pad) and a respective bondable pillar 414. Additionally, or alternatively, in some implementations, a distal end of each bondable pillar 414 may be disposed approximately 30 μm below a corresponding second electrical contact 412, as described above in connection with FIGS. 4A and 4B. In such implementations, the process 500 may include connecting each second electrical contact 412 to a distal end of a corresponding bondable pillar 414 that is disposed approximately 30 μm below, in a z-axis direction, the corresponding second electrical contact 412.

Figure 5G:
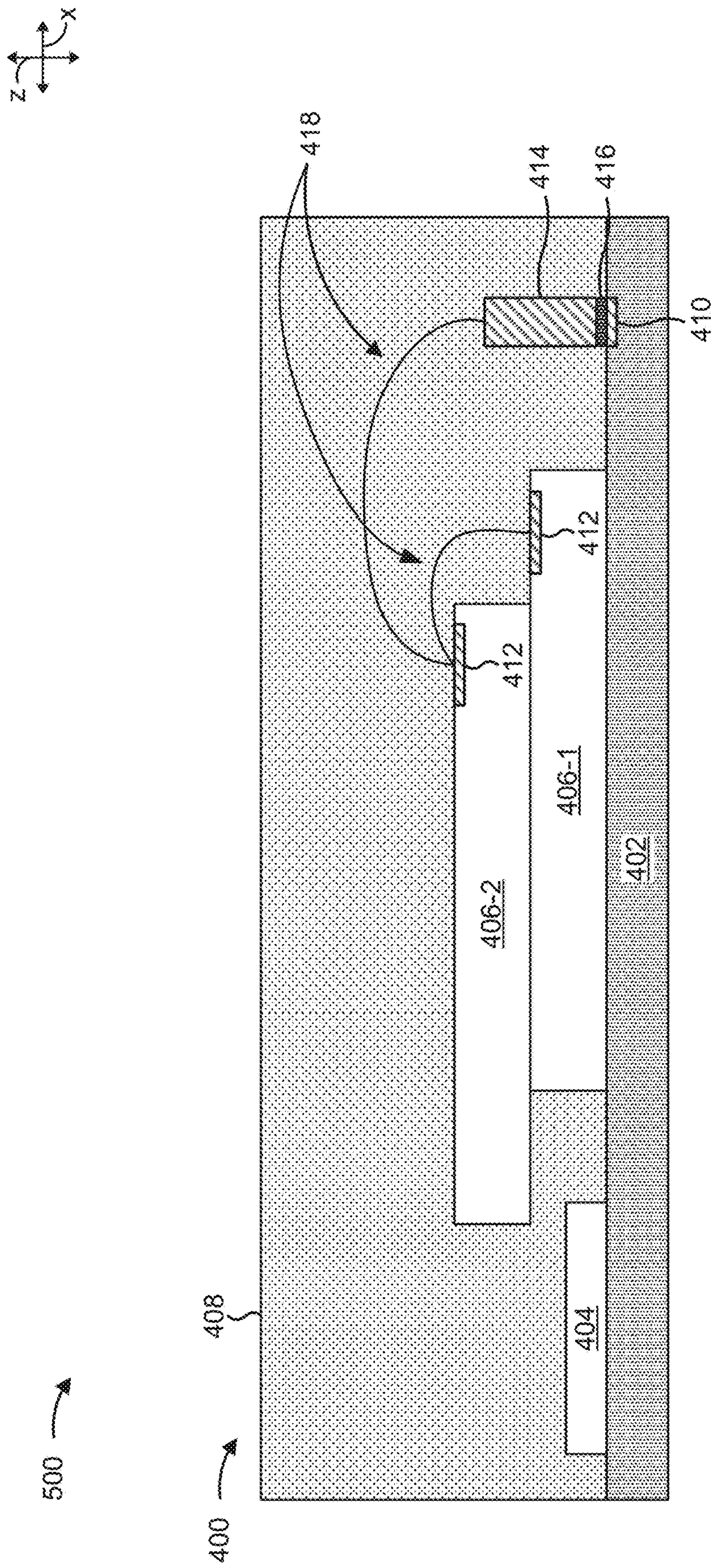

As shown by FIG. 5G, in some implementations, the process 500 may include encapsulating the one or more components of the semiconductor device assembly 400 (e.g., the controller 404, the dies 406, the bondable pillars 414, the wire bonds 418, and/or other components) in a casing 408, forming an enclosed semiconductor package, such as an mNAND device, an MCP device, or a similar device. In some implementations, the casing 408 may be an epoxy compound, such as a mold compound or similar material, that surrounds the various components and then is cured to harden and thus protect the various components of the semiconductor device assembly 400.

Based on utilizing a bondable pillar to form a wire bond between a die (e.g., a memory die) and a substrate, shorting of wires that is common with high die stacks found in memory packages and other semiconductor devices may be reduced or eliminated. More particularly, utilizing a bondable pillar to form a wire bond between a die and a substrate, as described above in connection with FIGS. 3B-5G, may reduce or eliminate wire sagging and/or wire sweeping, resulting in more robust semiconductor packages with reduced defects and more reliable operation.

As indicated above, FIGS. 5A-5G are provided as examples. Other examples may differ from what is described with respect to FIGS. 5A-5G.

Figure 6:
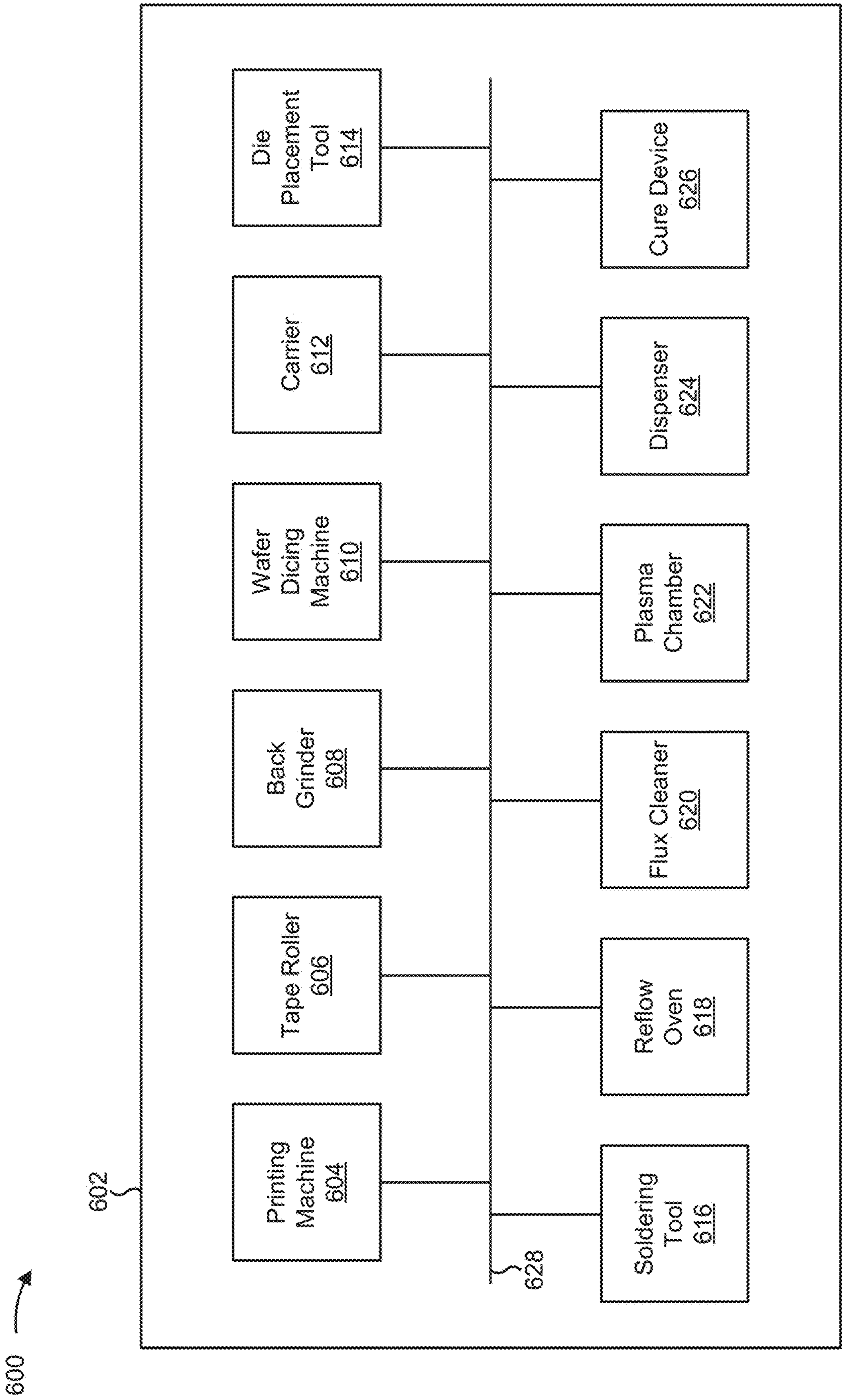
FIG. 6 is a diagram of example equipment used to manufacture various semiconductor packages, memory devices, or similar components described herein.

FIG. 6 is a diagram of example equipment 600 used to manufacture various semiconductor packages, memory devices, or similar components described herein. In some implementations, the equipment 600 may be used to perform the fabrication steps described above in connection with FIGS. 5A-5G, and/or the equipment may be used to fabricate a memory package or other semiconductor package or assembly including components described in connection with the example semiconductor device assembly 400 of FIGS. 4A-4B (e.g., the substrate 402, the controller 404, the dies 406, the casing 408, the electrical contacts 410, 412, the bondable pillars 414, the solder bonds 416, and/or the wire bonds 418).

As shown in FIG. 6, the equipment 600 may include a packaging system 602. The packaging system 602 may include one or more devices or tooling, such as a printing machine 604, a tape roller 606, a back grinder 608, a wafer dicing machine 610, a carrier 612, a die placement tool 614, a soldering tool 616, a reflow oven 618, a flux cleaner 620, a plasma chamber 622, a dispenser 624, and/or a cure device 626. One or more devices may be may physically or communicatively coupled to one another. For example, one or more devices may interconnect via wired connections and/or wireless connections, such as via a bus 628. Additionally, or alternatively, one or more devices may form part of an electronics assembly manufacturing line.

The printing machine 604 may be a device capable of printing patterns in a material such as silicon, a dielectric material, a polyimide layer, or a similar material, for purposes of forming an integrated circuit or the like. In some implementations, the printing machine 604 may be a lithography device capable of printing patterns in a material to form an integrated circuit. Additionally, or alternatively, the printing machine 604 may be capable of applying solder or other electrically conductive material to form a portion of an electrical connection to be formed between a die and a substrate. For example, the printing machine 604 may be capable of applying a grid of solder bumps to a die, which will align with a grid of bump pads on a substrate during a flip chip attachment process, or the like.

The tape roller 606 may be a device capable of laminating a tape (e.g., a back grinding tape, a die attach film (DAF), or a similar tape) on a semiconductor wafer and/or a semiconductor die. The tape roller 606 may be capable of applying pressure to a tape as the tape is being laminated onto a wafer or a die.

The back grinder 608 may be a device capable of grinding a backside of a semiconductor wafer and/or a semiconductor die, thereby reducing a thickness of the wafer and/or a die to a desired thickness. In some implementations, the back grinder 608 may be associated with a rotary table, a chuck table, and/or a grinding wheel for purposes of grinding a wafer and/or a die to a suitable thickness.

The wafer dicing machine 610 may be a device capable of dicing a die, such as a microcontroller, a memory die, or other semiconductor die, from a wafer. In some implementations, the wafer dicing machine 610 may include one or more blades and/or one or more lasers to dice a die from the wafer.

The carrier 612 may be a device capable of supporting and/or carrying a substrate during a die and/or chip attachment process, during a compression molding process, or during a similar process. The carrier 612 may be constructed from a non-contaminating material, such as quartz, glass, or a similar material, and may be capable of withstanding high temperatures. In that regard, the carrier 612 may be capable of carrying a substrate and/or one or more die through one or more ovens, such as a reflow oven 618 and/or a cure device 626.

The die placement tool 614 may be a high-precision tool capable of placing a die onto a substrate. In some implementations, the die placement tool 614 may be capable of flipping a flip chip die during a placement process, such that an active surface of the flip chip die, which may be facing up during preliminary manufacturing steps, may face the substrate during the flip chip die placement process. In some implementations, the die placement tool 614 may include one or more sensors capable of aligning bump bonds on a die with bond pads on a substrate during a flip chip die attachment process.

The soldering tool 616 may be capable of forming one or more solder connections between components of a semiconductor package. For example, the soldering tool 616 may be capable of forming wire bond connections between components of a semiconductor package by soldering wires connecting wire bond bands from one component to wire bond pads of another component. In some examples, the soldering tool 616 may be capable of applying a solder paste to between electrical contacts of electronic components, such as between bondable pillars and corresponding electrical contacts provided on a substrate.

The reflow oven 618 may be a device capable of heating components to a suitable temperature to cause a reflow of solder or other bonding material, thereby causing the solder or similar material to melt and make an electrical connection between two components.

The flux cleaner 620 may be a device capable of removing residual flux from a soldering process. In some implementations, the flux cleaner 620 may include a heater capable of removing residual flux through a heat treatment process. Additionally, or alternatively, the flux cleaner 620 may include a nozzle or similar device capable of applying a cleaning agent to a component in order to remove residual flux therefrom.

The plasma chamber 622 may be a device capable of providing plasma treatment to component. In some implementations, the plasma chamber 622 may be capable of directly or indirectly applying a plasma stream to an area of a component, such as for purposes of preparing the area on the component for receiving an epoxy underfill, or the like.

The dispenser 624 may be a device capable of dispensing a filler material around a die or similar component. In some implementations, the dispenser 624 may be capable of dispensing a mold compound (e.g., an epoxy mold compound) during a compression molding process. In some implementations, the dispenser 624 may include a dispensing needle capable of applying an epoxy underfill by capillary action under pressure, such as by dispensing underfill material around a periphery of a die and/or other electrical component such that the underfill material flows beneath the die and/or other electrical component and fills a space between the die and/or other electrical component and a substrate.

The cure device 626 may be a device capable of curing a material, such as an ultraviolet (UV) curable adhesive layer of a tape, a mold compound, such as an epoxy mold compound, an epoxy underfill material, a moldable underfill material, or a similar material. In some implementations, the cure device 626 may include a UV lamp capable of irradiating a tape with UV light in order to cure an adhesive layer thereof. In some implementations, the cure device 626 may be an oven configured to heat a mold compound to a suitable curing temperature. Additionally, or alternatively, the cure device 626 may be capable of curing a mold compound via a chemical reaction, by the application of UV light, by the application of other radiation, or the like.

The number and arrangement of devices and networks shown in FIG. 6 are provided as an example. In practice, there may be additional devices, fewer devices, different devices, or differently arranged devices than those shown in FIG. 6. Furthermore, two or more devices shown in FIG. 6 may be implemented within a single device, or a single device shown in FIG. 6 may be implemented as multiple, distributed devices. Additionally, or alternatively, a set of devices (e.g., one or more devices) of equipment 600 may perform one or more functions described as being performed by another set of devices of equipment 600.

Figure 7:
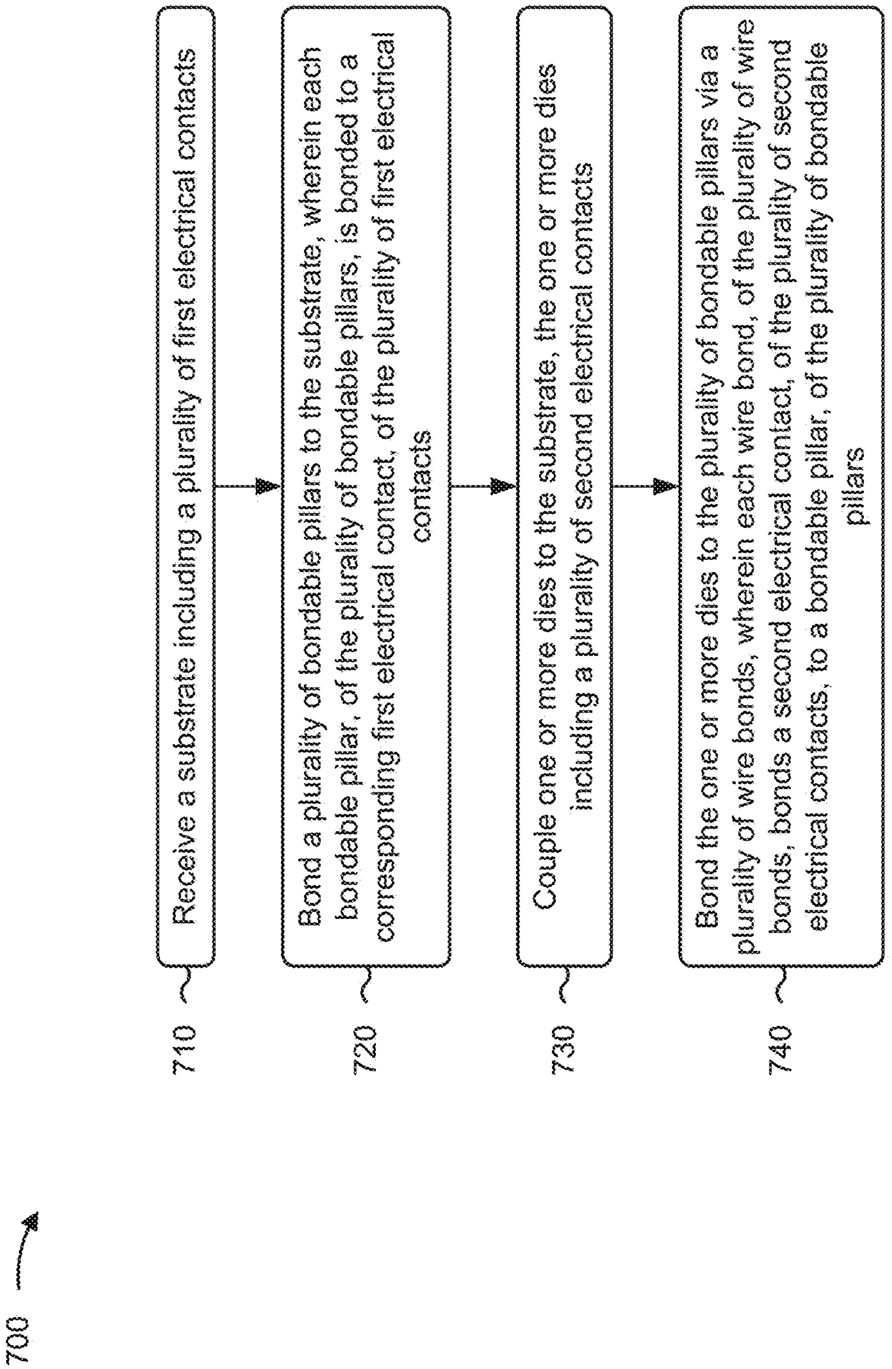
FIG. 7 is a flowchart of an example method of forming an integrated assembly or memory device having bondable pillars for wire bonds.

FIG. 7 is a flowchart of an example method 700 of forming an integrated assembly or memory device having bondable pillars for wire bonds. In some implementations, one or more process blocks of FIG. 7 may be performed by various semiconductor manufacturing equipment, such as the semiconductor manufacturing equipment described above in connection with FIG. 6 or similar semiconductor manufacturing equipment.

As shown in FIG. 7, the method 700 may include receiving a substrate including a plurality of first electrical contacts (block 710). As further shown in FIG. 7, the method 700 may include bonding a plurality of bondable pillars to the substrate, wherein each bondable pillar, of the plurality of bondable pillars, is bonded to a corresponding first electrical contact, of the plurality of first electrical contacts (block 720). As further shown in FIG. 7, the method 700 may include coupling one or more dies to the substrate, the one or more dies including a plurality of second electrical contacts (block 730). As further shown in FIG. 7, the method 700 may include bonding the one or more dies to the plurality of bondable pillars via a plurality of wire bonds, wherein each wire bond, of the plurality of wire bonds, bonds a second electrical contact, of the plurality of second electrical contacts, to a bondable pillar, of the plurality of bondable pillars (block 740).

The method 700 may include additional aspects, such as any single aspect or any combination of aspects described below and/or in connection with one or more other methods described elsewhere herein.

In a first aspect, bonding the plurality of bondable pillars to the substrate includes soldering the plurality of bondable pillars to the plurality of first electrical contacts using a solder paste.

In a second aspect, alone or in combination with the first aspect, the bondable pillars are copper pillars, and wherein soldering the plurality of bondable pillars to the plurality of first electrical contacts includes soldering the plurality of bondable pillars to the plurality of first electrical contacts using a gold solder paste.

In a third aspect, alone or in combination with one or more of the first and second aspects, bonding the one or more dies to the plurality of bondable pillars via the plurality of wire bonds includes connecting each second electrical contact, of the plurality of second electrical contacts, to a distal end of a corresponding bondable pillar, of the plurality of bondable pillars, that is disposed approximately 30 micrometers below, in a direction, the corresponding second electrical contact.

Although FIG. 7 shows example blocks of the method 700, in some implementations, the method 700 may include additional blocks, fewer blocks, different blocks, or differently arranged blocks than those depicted in FIG. 7. In some implementations, the method 700 may include forming the example semiconductor device assembly 400, an integrated assembly that includes the example semiconductor device assembly 400, any part described herein of the example semiconductor device assembly 400, and/or any part described herein of an integrated assembly that includes the example semiconductor device assembly 400. For example, the method 700 may include forming one or more of the substrate 402, the controller 404, the dies 406-1, 406-2, the casing 408, the electrical contacts 410, 412, the bondable pillars 414, the solder bonds 416, and/or the wire bonds 418.

Figure 8:
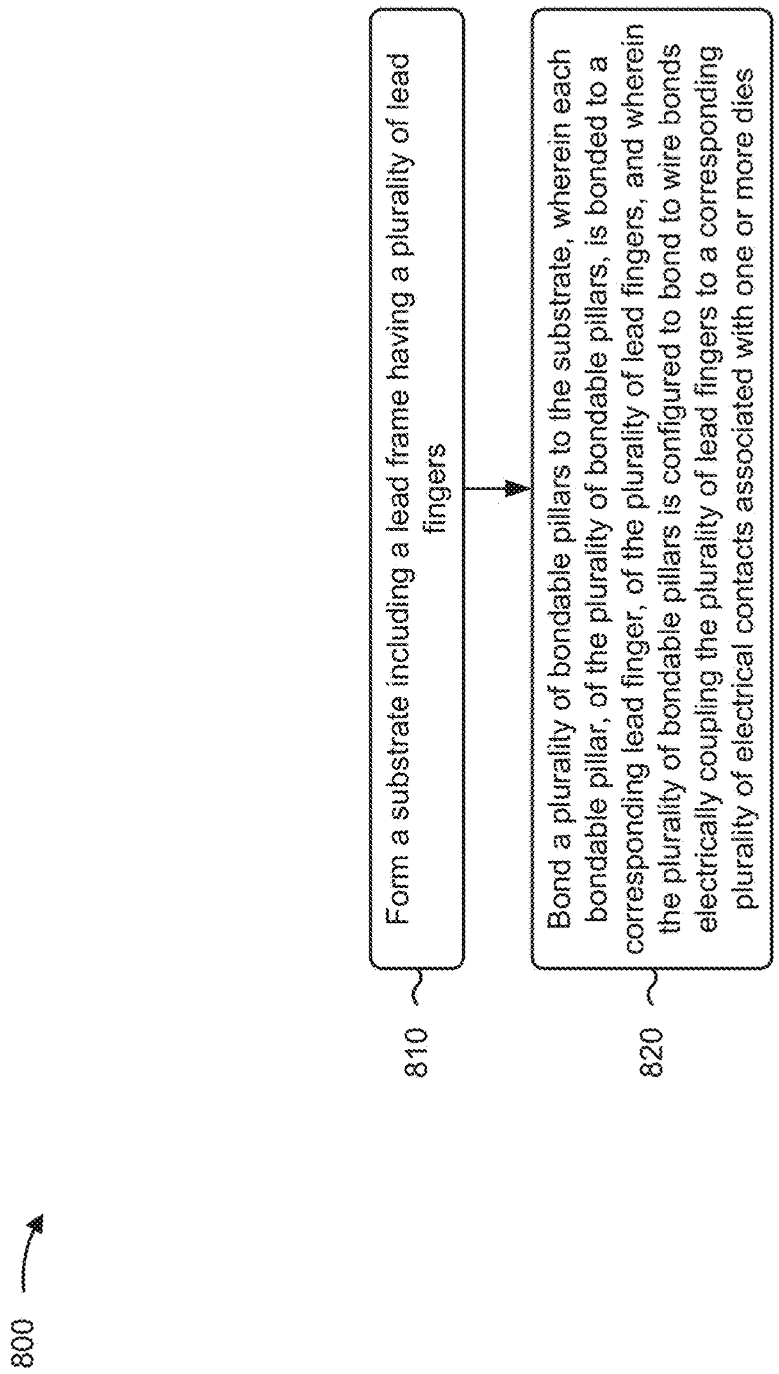
FIG. 8 is a flowchart of an example method of forming an integrated assembly or memory device having bondable pillars for wire bonds.

FIG. 8 is a flowchart of an example method 800 of forming an integrated assembly or memory device having bondable pillars for wire bonds. In some implementations, one or more process blocks of FIG. 8 may be performed by various semiconductor manufacturing equipment, such as the semiconductor manufacturing equipment described above in connection with FIG. 6 or similar semiconductor manufacturing equipment.

As shown in FIG. 8, the method 800 may include forming a substrate including a lead frame having a plurality of lead fingers (block 810). As further shown in FIG. 8, the method 800 may include bonding a plurality of bondable pillars to the substrate, wherein each bondable pillar, of the plurality of bondable pillars, is bonded to a corresponding lead finger, of the plurality of lead fingers, and wherein the plurality of bondable pillars is configured to bond to wire bonds electrically coupling the plurality of lead fingers to a corresponding plurality of electrical contacts associated with one or more dies (block 820).

The method 800 may include additional aspects, such as any single aspect or any combination of aspects described below and/or in connection with one or more other methods described elsewhere herein.

In a first aspect, bonding the plurality of bondable pillars to the substrate includes soldering the plurality of bondable pillars to the plurality of lead fingers using a solder paste.

In a second aspect, alone or in combination with the first aspect, the bondable pillars are copper bondable pillars, and wherein soldering the plurality of bondable pillars to the plurality of lead fingers includes soldering the plurality of bondable pillars to the plurality of lead fingers using a gold solder paste.

Although FIG. 8 shows example blocks of the method 800, in some implementations, the method 800 may include additional blocks, fewer blocks, different blocks, or differently arranged blocks than those depicted in FIG. 8. In some implementations, the method 800 may include forming the example semiconductor device assembly 400, an integrated assembly that includes the example semiconductor device assembly 400, any part described herein of the example semiconductor device assembly 400, and/or any part described herein of an integrated assembly that includes the example semiconductor device assembly 400. For example, the method 800 may include forming one or more of the substrate 402, the controller 404, the dies 406-1, 406-2, the casing 408, the electrical contacts 410, 412, the bondable pillars 414, the solder bonds 416, and/or the wire bonds 418.

In some implementations, a semiconductor device assembly includes a substrate including a plurality of first electrical contacts; a plurality of bondable pillars, wherein each bondable pillar, of the plurality of bondable pillars, is coupled to a corresponding first electrical contact, of the plurality of first electrical contacts; one or more dies coupled to the substrate and including a plurality of second electrical contacts; and a plurality of wire bonds, wherein each wire bond, of the plurality of wire bonds, bonds a second electrical contact, of the plurality of second electrical contacts, to a bondable pillar, of the plurality of bondable pillars.

In some implementations, a memory package includes a substrate including a plurality of first electrical contacts; a plurality of bondable pillars, wherein each bondable pillar, of the plurality of bondable pillars, is coupled to a corresponding first electrical contact, of the plurality of first electrical contacts; a memory controller coupled to the substrate; a memory die stack coupled to the substrate and including a plurality of memory dies and a plurality of second electrical contacts; and a plurality of wire bonds electrically coupling the memory die stack to the memory controller, wherein each wire bond, of the plurality of wire bonds, bonds a second electrical contact, of the plurality of second electrical contacts, to a bondable pillar, of the plurality of bondable pillars.

In some implementations, a method includes receiving a substrate including a plurality of first electrical contacts; bonding a plurality of bondable pillars to the substrate, wherein each bondable pillar, of the plurality of bondable pillars, is bonded to a corresponding first electrical contact, of the plurality of first electrical contacts; coupling one or more dies to the substrate, the one or more dies including a plurality of second electrical contacts; and bonding the one or more dies to the plurality of bondable pillars via a plurality of wire bonds, wherein each wire bond, of the plurality of wire bonds, bonds a second electrical contact, of the plurality of second electrical contacts, to a bondable pillar, of the plurality of bondable pillars.

In some implementations, a method includes forming a substrate including a lead frame having a plurality of lead fingers; and bonding a plurality of bondable pillars to the substrate, wherein each bondable pillar, of the plurality of bondable pillars, is bonded to a corresponding lead finger, of the plurality of lead fingers, and wherein the plurality of bondable pillars is configured to bond to wire bonds electrically coupling the plurality of lead fingers to a corresponding plurality of electrical contacts associated with one or more dies.

The foregoing disclosure provides illustration and description but is not intended to be exhaustive or to limit the implementations to the precise forms disclosed. Modifications and variations may be made in light of the above disclosure or may be acquired from practice of the implementations described herein.

The orientations of the various elements in the figures are shown as examples, and the illustrated examples may be rotated relative to the depicted orientations. The descriptions provided herein, and the claims that follow, pertain to any structures that have the described relationships between various features, regardless of whether the structures are in the particular orientation of the drawings, or are rotated relative to such orientation. Similarly, spatially relative terms, such as “below,” “beneath,” “lower,” “above,” “upper,” “middle,” “left,” and “right,” are used herein for ease of description to describe one element’s relationship to one or more other elements as illustrated in the figures. The spatially relative terms are intended to encompass different orientations of the element, structure, and/or assembly in use or operation in addition to the orientations depicted in the figures. A structure and/or assembly may be otherwise oriented (rotated 90 degrees or at other orientations), and the spatially relative descriptors used herein may be interpreted accordingly. Furthermore, the cross-sectional views in the figures only show features within the planes of the cross-sections, and do not show materials behind the planes of the cross-sections, unless indicated otherwise, in order to simplify the drawings.

As used herein, the terms "substantially" and "approximately" mean "within reasonable tolerances of manufacturing and measurement." All ranges described herein are inclusive of numbers at the ends of those ranges, unless specifically indicated otherwise.

Even though particular combinations of features are recited in the claims and/or disclosed in the specification, these combinations are not intended to limit the disclosure of implementations described herein. Many of these features may be combined in ways not specifically recited in the claims and/or disclosed in the specification. For example, the disclosure includes each dependent claim in a claim set in combination with every other individual claim in that claim set and every combination of multiple claims in that claim set. As used herein, a phrase referring to "at least one of" a list of items refers to any combination of those items, including single members. As an example, "at least one of: a, b, or c" is intended to cover a, b, c, a+b, a+c, b+c, and a+b+c, as well as any combination with multiples of the same element (e.g., a+a, a+a+a, a+a+b, a+a+c, a+b+b, a+c+c, b+b, b+b+b, b+b+c, c+c, and c+c+c, or any other ordering of a, b, and c).

No element, act, or instruction used herein should be construed as critical or essential unless explicitly described as such. Also, as used herein, the articles "a" and "an" are intended to include one or more items and may be used interchangeably with "one or more." Further, as used herein, the article "the" is intended to include one or more items referenced in connection with the article "the" and may be used interchangeably with "the one or more." Where only one item is intended, the phrase "only one," "single," or similar language is used. Also, as used herein, the terms "has," "have," "having," or the like are intended to be open-ended terms that do not limit an element that they modify (e.g., an element "having" A may also have B). Further, the phrase "based on" is intended to mean "based, at least in part, on" unless explicitly stated otherwise. As used herein, the term "multiple" can be replaced with "a plurality of" and vice versa. Also, as used herein, the term "or" is intended to be inclusive when used in a series and may be used interchangeably with "and/or," unless explicitly stated otherwise (e.g., if used in combination with "either" or "only one of").

What is claimed is:

1. A semiconductor device assembly, comprising:

a substrate including a plurality of first electrical contacts;

a plurality of bondable pillars, wherein each bondable pillar, of the plurality of bondable pillars, is coupled to a corresponding first electrical contact, of the plurality of first electrical contacts;

one or more dies coupled to the substrate and including a plurality of second electrical contacts; and a plurality of wire bonds, wherein each wire bond, of the plurality of wire bonds, bonds a second electrical contact, of the plurality of second electrical contacts, to a bondable pillar, of the plurality of bondable pillars; and wherein a distal end of each bondable pillar, of the plurality of bondable pillars, is disposed approximately 30 micrometers below, in a direction, a corresponding second electrical contact, of the plurality of second electrical contacts, to which the bondable pillar is electrically coupled via a corresponding wire bond, of the plurality of wire bonds.

2. The semiconductor device assembly of claim 1, wherein the plurality of first electrical contacts are lead fingers associated with a lead frame associated with the substrate.

3. The semiconductor device assembly of claim 1, wherein the plurality of wire bonds includes a plurality of gold wires.

4. The semiconductor device assembly of claim 1, wherein each bondable pillar, of the plurality of bondable pillars, is a copper pillar.

5. The semiconductor device assembly of claim 1, wherein each bondable pillar, of the plurality of bondable pillars, is coupled to the corresponding first electrical contact, of the plurality of first electrical contacts, via a solder bond.

6. The semiconductor device assembly of claim 5, wherein the solder bond includes a gold solder material.

7. The semiconductor device assembly of claim 1, wherein the one or more dies are mounted above, in the direction, the substrate.

8. The semiconductor device assembly of claim 1, wherein the one or more dies include a die stack including eight or more dies.

9. The semiconductor device assembly of claim 1, wherein a cross-sectional area of each bondable pillar, of the plurality of bondable pillars, is approximately equal to a surface area of each first electrical contact, of the plurality of first electrical contacts.

10. A memory package, comprising:

a substrate including a plurality of first electrical contacts;

a plurality of bondable pillars, wherein each bondable pillar, of the plurality of bondable pillars, is coupled to a corresponding first electrical contact, of the plurality of first electrical contacts;

a memory controller coupled to the substrate;

a memory die stack coupled to the substrate and including a plurality of memory dies and a plurality of second electrical contacts; and a plurality of wire bonds electrically coupling the memory die stack to the memory controller, wherein each wire bond, of the plurality of wire bonds, bonds a second electrical contact, of the plurality of second electrical contacts, to a bondable pillar, of the plurality of bondable pillars; and wherein a distal end of each bondable pillar, of the plurality of bondable pillars, is disposed approximately 30 micrometers below, in a direction, a corresponding second electrical contact, of the plurality of second electrical contacts, to which the bondable pillar is electrically coupled via a corresponding wire bond, of the plurality of wire bonds.

11. The memory package of claim 10, wherein the plurality of first electrical contacts are lead fingers associated with a lead frame associated with the substrate.

12. The memory package of claim 10, wherein the plurality of wire bonds includes a plurality of gold wires.

13. The memory package of claim 10, wherein each bondable pillar, of the plurality of bondable pillars, is a copper pillar.

14. The memory package of claim 10, wherein each bondable pillar, of the plurality of bondable pillars, is coupled to the corresponding first electrical contact, of the plurality of first electrical contacts, using a solder bond.

15. The memory package of claim 14, wherein the solder bond includes a gold solder material.

16. The memory package of claim 10, wherein the memory die stack is mounted above, in the direction, the substrate.

17. The memory package of claim 10, wherein the memory die stack includes eight or more memory dies.

18. The memory package of claim 10, wherein a cross-sectional area of each bondable pillar, of the plurality of bondable pillars, is approximately equal to a surface area of each first electrical contact, of the plurality of first electrical contacts.

19. A method, comprising:

receiving a substrate including a plurality of first electrical contacts;

bonding a plurality of bondable pillars to the substrate, wherein each bondable pillar, of the plurality of bondable pillars, is bonded to a corresponding first electrical contact, of the plurality of first electrical contacts;

coupling one or more dies to the substrate, the one or more dies including a plurality of second electrical contacts; and bonding the one or more dies to the plurality of bondable pillars via a plurality of wire bonds, wherein each wire bond, of the plurality of wire bonds, bonds a second electrical contact, of the plurality of second electrical contacts, to a bondable pillar, of the plurality of bondable pillars; and wherein bonding the one or more dies to the plurality of bondable pillars via the plurality of wire bonds includes connecting each second electrical contact, of the plurality of second electrical contacts, to a distal end of a corresponding bondable pillar, of the plurality of bondable pillars, that is disposed approximately 30 micrometers below, in a direction, the second electrical contact.

20. The method of claim 19, wherein bonding the plurality of bondable pillars to the substrate includes soldering the plurality of bondable pillars to the plurality of first electrical contacts using a solder paste.

21. The method of claim 20, wherein the bondable pillars are copper pillars, and wherein soldering the plurality of bondable pillars to the plurality of first electrical contacts includes soldering the plurality of bondable pillars to the plurality of first electrical contacts using a gold solder paste.

22. The method of claim 19, wherein a cross-sectional area of each bondable pillar, of the plurality of bondable pillars, is approximately equal to a surface area of each first electrical contact, of the plurality of first electrical contacts.

23. A method, comprising:

forming a substrate including a lead frame having a plurality of lead fingers; and bonding a plurality of bondable pillars to the substrate, wherein each bondable pillar, of the plurality of bondable pillars, is bonded to a corresponding lead finger, of the plurality of lead fingers, and wherein the plurality of bondable pillars is configured to bond to wire bonds electrically coupling the plurality of lead fingers to a corresponding plurality of electrical contacts associated with one or more dies.

24. The method of claim 23, wherein bonding the plurality of bondable pillars to the substrate includes soldering the plurality of bondable pillars to the plurality of lead fingers using a solder paste.

25. The method of claim 24, wherein the bondable pillars are copper bondable pillars, and wherein soldering the plurality of bondable pillars to the plurality of lead fingers includes soldering the plurality of bondable pillars to the plurality of lead fingers using a gold solder paste.

* * * * *